United States Patent
Venkatachari et al.

(10) Patent No.: US 11,882,530 B2
(45) Date of Patent: Jan. 23, 2024

(54) COMMON AUTOMATIC GAIN CONTROL ACROSS MULTIPLE RADIO ACCESS TECHNOLOGIES

(71) Applicant: Qualcomm Incorporated, San Diego, CA (US)

(72) Inventors: Harish Venkatachari, San Jose, CA (US); Paolo Minero, La Jolla, CA (US); Rui Li, San Jose, CA (US); Qian Ma, San Diego, CA (US); Antriksh Pany, San Diego, CA (US); Masoud Azmoodeh, San Diego, CA (US); Yu Fu, San Diego, CA (US); Ashwin Alur Sreesha, San Jose, CA (US); Rimal Patel, San Diego, CA (US); Arpit Chitransh, Hyderabad (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/779,464

(22) PCT Filed: Dec. 11, 2020

(86) PCT No.: PCT/US2020/064575
§ 371 (c)(1),
(2) Date: May 24, 2022

(87) PCT Pub. No.: WO2021/119469
PCT Pub. Date: Jun. 17, 2021

(65) Prior Publication Data
US 2023/0007601 A1    Jan. 5, 2023

(30) Foreign Application Priority Data
Dec. 13, 2019  (IN) .............................. 201941051712

(51) Int. Cl.
*H04W 52/52* (2009.01)
*H04B 17/318* (2015.01)
(Continued)

(52) U.S. Cl.
CPC .......... *H04W 52/52* (2013.01); *H04B 17/318* (2015.01); *H04W 52/245* (2013.01); *H04W 88/06* (2013.01)

(58) Field of Classification Search
CPC ... H04W 52/52; H04W 52/245; H04W 88/06; H04B 17/318
See application file for complete search history.

(56) References Cited

U.S. PATENT DOCUMENTS 6,055,168 A * 4/2000 Kotowski ............... H02M 3/07
                                                     363/60
6,144,254 A * 11/2000 Irvine .................. H03G 1/0023
                                                     330/51
(Continued)

FOREIGN PATENT DOCUMENTS

CN      104052420 A    9/2014
CN      104662803 A    5/2015
(Continued)

OTHER PUBLICATIONS

International Search Report and Written Opinion—PCT/US2020/064575—ISA/EPO—dated Mar. 26, 2021.

*Primary Examiner* — Hai V Nguyen
(74) *Attorney, Agent, or Firm* — Holland & Hart LLP

(57) ABSTRACT

Methods, systems, and devices for wireless communications are described. A user equipment (UE) may operate in a dual-connectivity (DC) configuration, and may measure signals from more than one radio access technology (RAT). The UE may receive a first signal power for a first RAT and a second signal power for a second RAT. The UE may determine a common gain state for the first RAT and the (Continued)

second RAT based on the first signal power and the second signal power. The UE may then apply the common gain state to a first receiver chain within the UE for the first RAT and to a second receiver chain within the UE for the second RAT, where the first receiver chain and the second receiver chain share at least one shared low noise amplifier (LNA).

30 Claims, 13 Drawing Sheets

(51) Int. Cl.
*H04W 52/24* (2009.01)
*H04W 88/06* (2009.01)

(56) References Cited

U.S. PATENT DOCUMENTS

| | | | | |
|---|---|---|---|---|
| 6,169,673 | B1* | 1/2001 | McIntyre | H02M 3/07 363/59 |
| 6,198,645 | B1* | 3/2001 | Kotowski | H02M 3/18 363/59 |
| 6,933,779 | B2* | 8/2005 | Lee | H03G 1/0088 330/51 |
| 8,290,461 | B1* | 10/2012 | Sankaran | H04B 1/0475 455/552.1 |
| 9,084,287 | B2* | 7/2015 | Swaminathan | H04W 88/06 |
| 9,288,776 | B2 | 3/2016 | Sun et al. | |
| 10,420,161 | B1 | 9/2019 | Sava et al. | |
| 10,666,485 | B2* | 5/2020 | Zeng | H04J 11/0076 |
| 10,727,800 | B2* | 7/2020 | Kajakine | H03G 3/3078 |
| 11,025,456 | B2* | 6/2021 | Chatterjee | H04W 72/1273 |
| 2004/0056712 | A1* | 3/2004 | Lee | H03G 1/0088 330/129 |
| 2008/0293368 | A1 | 11/2008 | Desai et al. | |
| 2009/0180451 | A1* | 7/2009 | Alpert | H04W 72/1215 370/338 |
| 2010/0237946 | A1* | 9/2010 | Li | H03F 1/342 330/278 |
| 2012/0314712 | A1* | 12/2012 | Sato | H03G 1/0088 370/401 |
| 2012/0319775 | A1 | 12/2012 | Nakamura | |
| 2013/0201890 | A1* | 8/2013 | Swaminathan | H04W 88/06 370/328 |
| 2015/0358928 | A1 | 12/2015 | Dural et al. | |
| 2016/0269260 | A1* | 9/2016 | Kazmi | H04L 1/20 |
| 2016/0330676 | A1* | 11/2016 | Thangarasa | H04W 76/14 |
| 2017/0181166 | A1* | 6/2017 | Ananda | H04B 1/1081 |
| 2017/0296080 | A1* | 10/2017 | Yoon | A61B 5/316 |
| 2018/0062602 | A1* | 3/2018 | Kajakine | H03G 3/3078 |
| 2018/0091108 | A1 | 3/2018 | Zhao et al. | |
| 2018/0324023 | A1* | 11/2018 | Zeng | H04J 13/0003 |
| 2019/0149365 | A1* | 5/2019 | Chatterjee | H04L 25/0226 370/329 |
| 2019/0289611 | A1 | 9/2019 | Bhattacharya et al. | |
| 2019/0320358 | A1* | 10/2019 | Knapp | H04W 52/0241 |
| 2021/0288842 | A1* | 9/2021 | Chatterjee | H04W 80/02 |
| 2022/0167448 | A1* | 5/2022 | Palle | H04W 76/30 |
| 2022/0182951 | A1* | 6/2022 | Zhou | H04W 4/06 |
| 2022/0191733 | A1* | 6/2022 | Ali | H04W 4/40 |
| 2022/0191916 | A1* | 6/2022 | Talarico | H04L 1/1614 |
| 2022/0256519 | A1* | 8/2022 | Jeon | G01S 7/0233 |
| 2022/0312324 | A1* | 9/2022 | Thangarasa | H04W 68/02 |
| 2023/0022915 | A1* | 1/2023 | Bhamri | H04B 7/0408 |
| 2023/0090460 | A1* | 3/2023 | Jiang | H03F 1/0205 330/277 |

FOREIGN PATENT DOCUMENTS

CN 107431465 A 12/2017
WO WO-201569570 5/2015

* cited by examiner

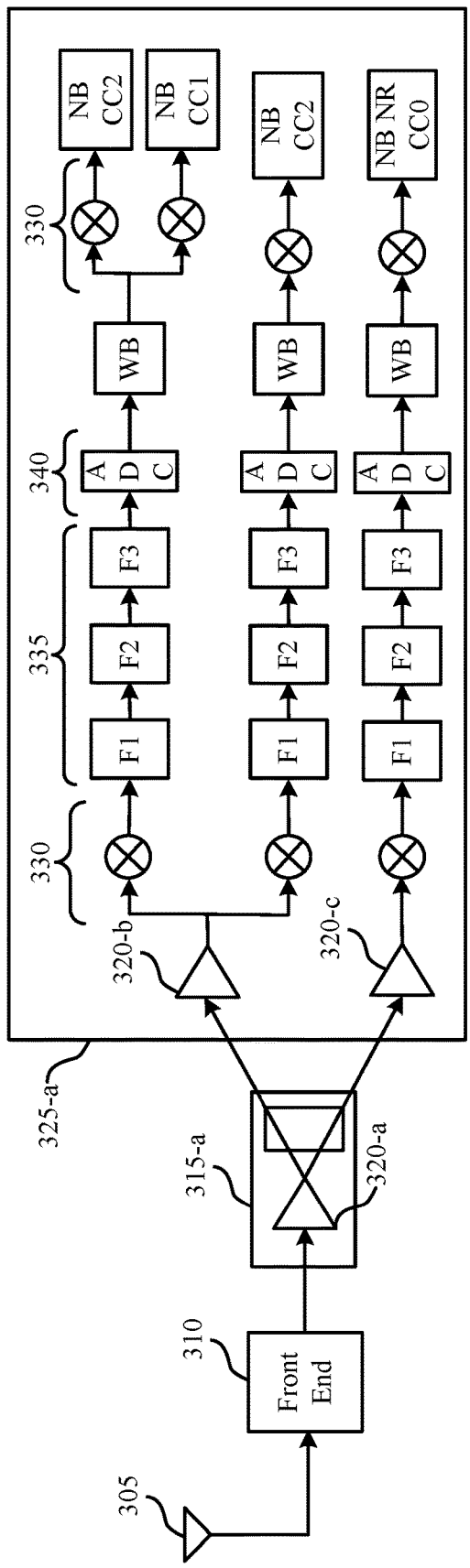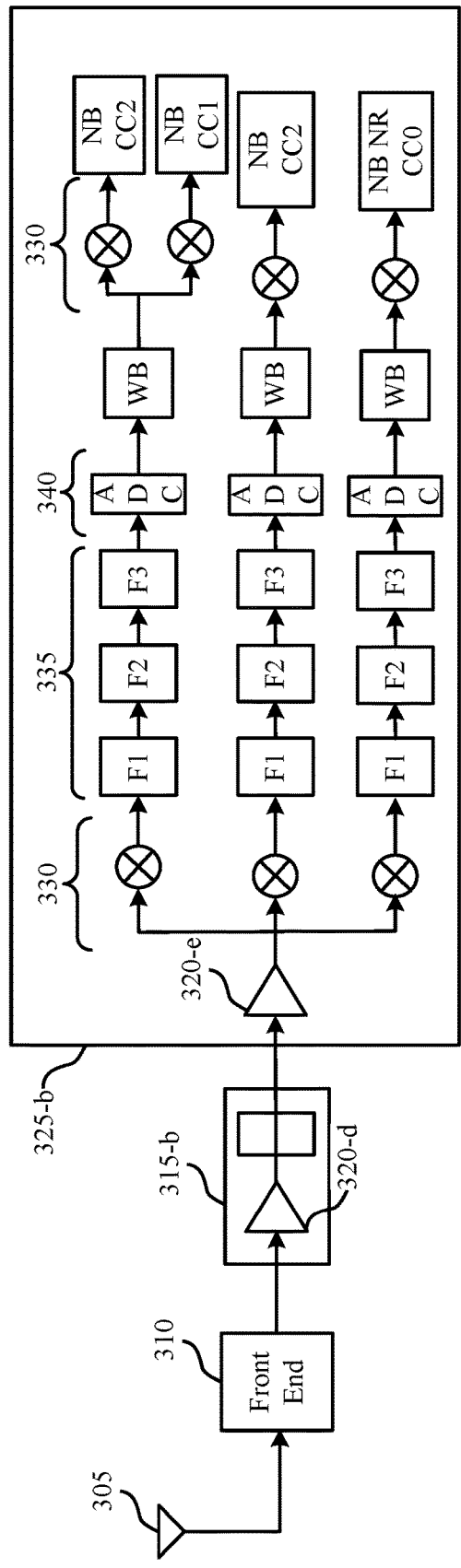
FIG. 3A
FIG. 3B

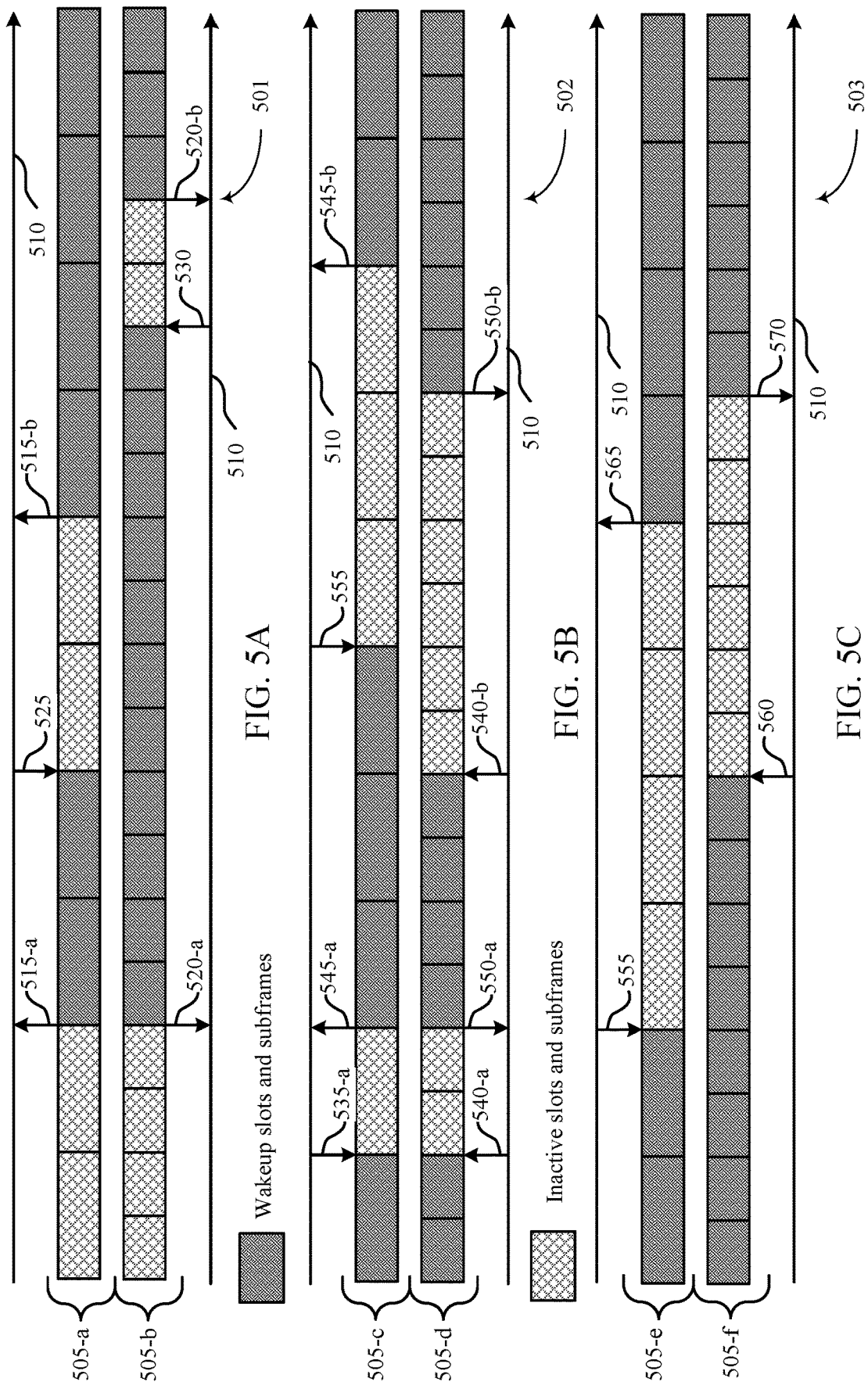

COMMON AUTOMATIC GAIN CONTROL ACROSS MULTIPLE RADIO ACCESS TECHNOLOGIES

CROSS REFERENCE TO RELATED APPLICATIONS

The present Application is a 371 national stage filing of International PCT Application No. PCT/US2020/064575 by Venkatachari et al., entitled "COMMON AUTOMATIC GAIN CONTROL ACROSS MULTIPLE RADIO ACCESS TECHNOLOGIES," filed Dec. 11, 2020; and claims priority to India Provisional Patent Application No. 201941051712 by Venkatachari et al., entitled "COMMON AUTOMATIC GAIN CONTROL ACROSS MULTIPLE RADIO ACCESS TECHNOLOGIES," filed Dec. 13, 2019, each of which is assigned to the assignee hereof, and each of which is expressly incorporated by reference in its entirety herein.

FIELD OF TECHNOLOGY

The following relates generally to wireless communications and more specifically to common automatic gain control across multiple radio access technologies.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (TDMA), orthogonal frequency division multiple access (OFDMA), or discrete Fourier transform spread orthogonal frequency division multiplexing (DFT-S-OFDM). A wireless multiple-access communications system may include one or more base stations or one or more network access nodes, each simultaneously supporting communication for multiple communication devices, which may be otherwise known as user equipment (UE).

A UE may be configured to support communications on more than one radio access technology (RAT). UE circuitry may include components for applying gain to receiver circuitry within the UE, and the UE circuitry may be separate for both RATs. Techniques for applying gain to circuitry that supports more than one RAT may suffer from a variety of performance losses, such as a poor signal to noise ratio (SNR).

SUMMARY

The described techniques relate to improved methods, systems, devices, and apparatuses that support common automatic gain control across multiple radio access technologies. Generally, the described techniques provide for cases where user equipment (UE) may operate in a dual-connectivity (DC) configuration, and may measure signals from more than one radio access technology (RAT). The UE may measure a first signal power for a first RAT and a second signal power for a second RAT. The UE may determine a common gain state for the first RAT and the second RAT based on inputting the first signal power and the second signal power into an aggregation function. The UE may then apply the common gain state to a first receiver chain within the UE for the first RAT and to a second receiver chain within the UE for the second RAT, where the first receiver chain and the second receiver chain share at least one shared low noise amplifier (LNA) or another type of front-end RF component.

A method of wireless communications at a UE is described. The method may include measuring a first signal power for a first RAT and a second signal power for a second RAT different from the first RAT, determining a common gain state for the first RAT and the second RAT based on the first signal power and the second signal, and applying the common gain state to a first receiver chain within the UE for the first RAT and to a second receiver chain within the UE for the second RAT, where the first receiver chain and the second receiver chain share at least one shared LNA.

An apparatus for wireless communications at a UE is described. The apparatus may include a processor, memory coupled with the processor, and instructions stored in the memory. The instructions may be executable by the processor to cause the apparatus to measure a first signal power for a first RAT and a second signal power for a second RAT different from the first RAT, determine a common gain state for the first RAT and the second RAT based on the first signal power and the second signal power, and apply the common gain state to a first receiver chain within the UE for the first RAT and to a second receiver chain within the UE for the second RAT, where the first receiver chain and the second receiver chain share at least one shared LNA.

Another apparatus for wireless communications at a UE is described. The apparatus may include means for measuring a first signal power for a first RAT and a second signal power for a second RAT different from the first RAT, determining a common gain state for the first RAT and the second RAT based on the first signal power and the second signal power, and applying the common gain state to a first receiver chain within the UE for the first RAT and to a second receiver chain within the UE for the second RAT, where the first receiver chain and the second receiver chain share at least one shared LNA.

A non-transitory computer-readable medium storing code for wireless communications at a UE is described. The code may include instructions executable by a processor to measure a first signal power for a first RAT and a second signal power for a second RAT different from the first RAT, determine a common gain state for the first RAT and the second RAT based on the first signal power and the second signal power, and apply the common gain state to a first receiver chain within the UE for the first RAT and to a second receiver chain within the UE for the second RAT, where the first receiver chain and the second receiver chain share at least one shared LNA.

Some examples of the method, apparatuses, and non-transitory computer-readable medium described herein may further include operations, features, means, or instructions for measuring first signal strength indicators that may be based on measurements from one or more carriers associated with the first RAT, and measuring second signal strength indicators that may be based on measurements from one or more carriers associated with the second RAT, where the first signal power and the second signal power may be based on first and second signal strength indicators.

Some examples of the method, apparatuses, and non-transitory computer-readable medium described herein may further include operations, features, means, or instructions for aggregating the first signal strength indicators across the one or more carriers associated with the first RAT to generate first aggregated signal strength indicators, and aggregating the second signal strength indicators across the one or more carriers associated with the second RAT to generate second aggregated signal strength indicators.

Some examples of the method, apparatuses, and non-transitory computer-readable medium described herein may further include operations, features, means, or instructions for receiving a request to freeze the common gain state, for a duration, based on a first gain state for the first RAT or a second gain state for the second RAT.

Some examples of the method, apparatuses, and non-transitory computer-readable medium described herein may further include operations, features, means, or instructions for rejecting the request to freeze the common gain state.

Some examples of the method, apparatuses, and non-transitory computer-readable medium described herein may further include operations, features, means, or instructions for applying a freeze to the common gain state, for the duration, based on the request, and applying a subsequent common gain state to the first receiver chain and the second receiver chain after the duration.

Some examples of the method, apparatuses, and non-transitory computer-readable medium described herein may further include operations, features, means, or instructions for overriding the common gain state with a different gain state that may be selected for the first RAT or the second RAT.

Some examples of the method, apparatuses, and non-transitory computer-readable medium described herein may further include operations, features, means, or instructions for handling a first gain state for the first RAT and a second gain state for the second RAT within a threshold time of a common inter-RAT gap opening wherein the first RAT and the second RAT are inactive; and determining a first common gain state outside of the common inter-RAT gap opening and a second common gain state during the common inter-RAT gap opening based at least in part on configuring one or more simultaneous measurements of the first RAT and the second RAT using the shared LNA.

Some examples of the method, apparatuses, and non-transitory computer-readable medium described herein may further include operations, features, means, or instructions for determining the common gain state for the first RAT and the second RAT based at least in part on inputting the first signal power and the second signal power into an aggregation function.

In some examples of the method, apparatuses, and non-transitory computer-readable medium described herein, the aggregation function includes a weighted average of the first signal power and the second signal power.

In some examples of the method, apparatuses, and non-transitory computer-readable medium described herein, the weighted average of the first signal power and the second signal power includes a weighted average of signal powers for a set of carriers associated with the first RAT, the second RAT, or both.

In some examples of the method, apparatuses, and non-transitory computer-readable medium described herein, the aggregation function includes a maximum of a first gain state associated with the first signal power and a second gain state associated with the second signal power.

In some examples of the method, apparatuses, and non-transitory computer-readable medium described herein, the aggregation function may be further based on a gain state for the first RAT, the second RAT, or both.

In some examples of the method, apparatuses, and non-transitory computer-readable medium described herein, the UE includes a first subscriber identity module (SIM) for the first RAT and a second SIM for the second RAT.

BRIEF DESCRIPTION OF THE DRAWINGS

FIGS. 3A and 3B illustrate examples of circuit diagrams that support common automatic gain control across multiple radio access technologies in accordance with aspects of the present disclosure.

FIGS. 5A, 5B, and 5C illustrate examples of slot diagrams that support common automatic gain control across multiple radio access technologies in accordance with aspects of the present disclosure.

DETAILED DESCRIPTION

In some cases, a user equipment (UE) may operate in a dual connectivity (DC) configuration, and may communicate according to multiple radio access technologies (RATs) at once. For example, the UE may operate in Evolved Universal Terrestrial Radio Access (E-UTRA) New Radio (NR) dual connectivity (EN-DC). In this example, the UE may operate according to Long-Term Evolution (LTE) and NR procedures.

In DC applications, a UE may have circuitry that is configured such that a low noise amplifier (LNA) may be shared across the receiver chains of two different radio access technologies (RATs). The UE may coordinate the gain state across the receive paths for the two RATs, as the UE may otherwise apply different gain states to each receive chain based on the receive chain itself, which may lead to performance losses. The performance losses may include glitches, a poor signal to noise ratio (SNR) leading to poor throughput and coverage loss, and other losses and inefficiencies. Further, in cases where different gain states are applied for a shared LNA, the UE may also determine incorrect measurements for reporting, experience mobility issues and call drops, have an inability to support features such as connected mode diversity receive chains (CDRx) and also have an inability to support optimal performance for different subscriber identity module (SIM) configurations, such as shared-SIM (SSIM) and multi-SIM (MSIM) shared LNA cases for particular band combinations.

In order to avoid such issues, the UE may coordinate the gain state between multiple RATs. The UE may include specific firmware or hardware that receives received signal strength indicator (RSSI) and other signal quality information from the communications received from each RAT. The UE or firmware may determine a common gain state to apply to the filtering and amplification chains of the circuitry corresponding to each RAT. The common gain state may be determine based on an aggregation function. The aggregation function may average determined gains for each chain, sum the determined gains, select a maximum or minimum gain based on RSSI or other information, or may be a different type of function.

The common gain state may be applied after the shared LNA, as part of automatic gain control (AGC). The AGC may be applied in cases of an external or internal shared LNA.

Aspects of the disclosure are initially described in the context of wireless communications systems. Aspects of the disclosure are then described in the context of circuit diagrams. SIM diagrams, slot configurations, slot diagrams, and process flows. Aspects of the disclosure are further illustrated by and described with reference to apparatus diagrams, system diagrams, and flowcharts that relate to common automatic gain control across multiple radio access technologies.

Figure 1:
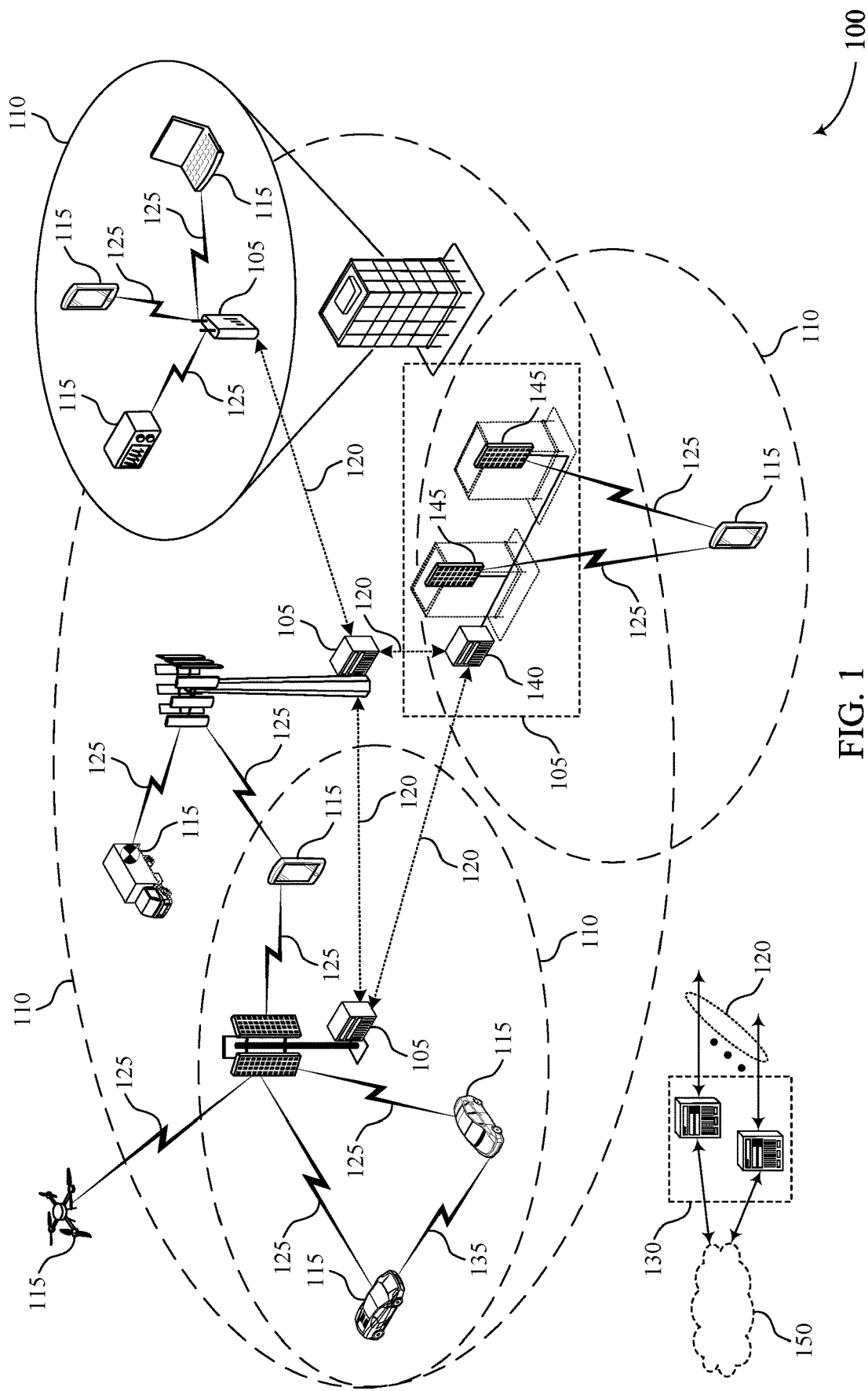
FIG. 1 illustrates an example of a wireless communications system that supports common automatic gain control across multiple radio access technologies in accordance with aspects of the present disclosure.

FIG. 1 illustrates an example of a wireless communications system 100 that supports common automatic gain control across multiple radio access technologies in accordance with aspects of the present disclosure. The wireless communications system 100 may include one or more base stations 105, one or more UEs 115, and a core network 130. In some examples, the wireless communications system 100 may be a LTE network, an LTE-Advanced (LTE-A) network, an LTE-A Pro network, or a NR network. In some examples, the wireless communications system 100 may support enhanced broadband communications, ultra-reliable (e.g., mission critical) communications, low latency communications, communications with low-cost and low-complexity devices, or any combination thereof.

The base stations 105 may be dispersed throughout a geographic area to form the wireless communications system 100 and may be devices in different forms or having different capabilities. The base stations 105 and the UEs 115 may wirelessly communicate via one or more communication links 125. Each base station 105 may provide a coverage area 110 over which the UEs 115 and the base station 105 may establish one or more communication links 125. The coverage area 110 may be an example of a geographic area over which a base station 105 and a UE 115 may support the communication of signals according to one or more radio access technologies.

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115, the base stations 105, or network equipment (e.g., core network nodes, relay devices, integrated access and backhaul (IAB) nodes, or other network equipment), as shown in FIG. 1.

The base stations 105 may communicate with the core network 130, or with one another, or both. For example, the base stations 105 may interface with the core network 130 through one or more backhaul links 120 (e.g., via an S1, N2, N3, or other interface). The base stations 105 may communicate with one another over the backhaul links 120 (e.g., via an X2, Xn, or other interface) either directly (e.g., directly between base stations 105), or indirectly (e.g., via core network 130), or both In some examples, the backhaul links 120 may be or include one or more wireless links.

One or more of the base stations 105 described herein may include or may be referred to by a person having ordinary skill in the art as a base transceiver station, a radio base station, an access point, a radio transceiver, a NodeB, an eNodeB (eNB), a next-generation NodeB or a giga-NodeB (either of which may be referred to as a gNB), a Home NodeB, a Home eNodeB, or other suitable terminology.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the base stations 105 and the network equipment including macro eNBs or gNBs, small cell eNBs or gNBs, or relay base stations, among other examples, as shown in FIG. 1.

The UEs 115 and the base stations 105 may wirelessly communicate with one another via one or more communication links 125 over one or more carriers. The term "carrier" may refer to a set of radio frequency spectrum resources having a defined physical layer structure for supporting the communication links 125. For example, a carrier used for a communication link 125 may include a portion of a radio frequency spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

In some examples (e.g., in a carrier aggregation configuration), a carrier may also have acquisition signaling or control signaling that coordinates operations for other carriers. A carrier may be associated with a frequency channel (e.g., an evolved universal mobile telecommunication system terrestrial radio access (E-UTRA) absolute radio frequency channel number (EARFCN)) and may be positioned according to a channel raster for discovery by the UEs 115. A carrier may be operated in a standalone mode where initial acquisition and connection may be conducted by the UEs 115 via the carrier, or the carrier may be operated in a non-standalone mode where a connection is anchored using a different carrier (e.g., of the same or a different radio access technology).

The communication links 125 shown in the wireless communications system 100 may include uplink transmissions from a UE 115 to a base station 105, or downlink transmissions from a base station 105 to a UE 115, Carriers may carry downlink or uplink communications (e.g., in an FDD mode) or may be configured to carry downlink and uplink communications (e.g., in a TDD mode).

A carrier may be associated with a particular bandwidth of the radio frequency spectrum, and in some examples the carrier bandwidth may be referred to as a "system bandwidth" of the carrier or the wireless communications system 100, For example, the carrier bandwidth may be one of a number of determined bandwidths for carriers of a particular radio access technology (e.g., 1.4, 3, 5, 10, 15, 20, 40, or 80 megahertz (MHz)). Devices of the wireless communications system 100 (e.g., the base stations 105, the UEs 115, or both) may have hardware configurations that support communications over a particular carrier bandwidth or may be configurable to support communications over one of a set of carrier bandwidths. In some examples, the wireless communications system 100 may include base stations 105 or UEs 115 that support simultaneous communications via carriers associated with multiple carrier bandwidths. In some examples, each served UE 115 may be configured for operating over portions (e.g., a sub-band, a BWP) or all of a carrier bandwidth.

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme, the coding rate of the modulation scheme, or both). Thus, the more resource elements that a UE 115 receives and the higher the order of the modulation scheme, the higher the data rate may be for the UE 115. A wireless communications resource may refer to a combination of a radio frequency spectrum resource, a time resource, and a spatial resource (e.g., spatial layers or beams), and the use of multiple spatial layers may further increase the data rate or data integrity for communications with a UE 115.

One or more numerologies for a carrier may be supported, where a numerology may include a subcarrier spacing ($\Delta f$) and a cyclic prefix. A carrier may be divided into one or more BWPs having the same or different numerologies. In some examples, a UE 115 may be configured with multiple BWPs. In some examples, a single BWP for a carrier may be active at a given time and communications for the UE 115 may be restricted to one or more active BWPs.

The time intervals for the base stations 105 or the UEs 115 may be expressed in multiples of a basic time unit which may, for example, refer to a sampling period of $T_s=1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a number of slots. Alternatively, each frame may include a variable number of slots, and the number of slots may depend on subcarrier spacing. Each slot may include a number of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., the number of symbol periods in a TTI) may be variable. Additionally or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a number of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

Each base station 105 may provide communication coverage via one or more cells, for example a macro cell, a small cell, a hot spot or other types of cells, or any combination thereof. The term "cell" may refer to a logical communication entity used for communication with a base station 105 (e.g., over a carrier) and may be associated with an identifier for distinguishing neighboring cells (e.g., a physical cell identifier (PCID), a virtual cell identifier (VCID), or others). In some examples, a cell may also refer to a geographic coverage area 110 or a portion of a geographic coverage area 110 (e.g., a sector) over which the logical communication entity operates. Such cells may range from smaller areas (e.g., a structure, a subset of structure) to larger areas depending on various factors such as the capabilities of the base station 105. For example, a cell may be or include a building, a subset of a building, or exterior spaces between or overlapping with geographic coverage areas 110, among other examples.

A macro cell generally covers a relatively large geographic area (e.g., several kilometers in radius) and may allow unrestricted access by the UEs 115 with service subscriptions with the network provider supporting the macro cell. A small cell may be associated with a lower-powered base station 105, as compared with a macro cell, and a small cell may operate in the same or different (e.g., licensed, unlicensed) frequency bands as macro cells. Small cells may provide unrestricted access to the UEs 115 with service subscriptions with the network provider or may provide restricted access to the UEs 115 having an association with the small cell (e.g., the UEs 115 in a closed subscriber group (CSG), the UEs 115 associated with users in a home or office). A base station 105 may support one or multiple cells and may also support communications over the one or more cells using one or multiple component carriers.

In some examples, a carrier may support multiple cells, and different cells may be configured according to different protocol types (e.g., MTC, narrowband IoT (NB-IoT), enhanced mobile broadband (eMBB)) that may provide access for different types of devices.

In some examples, a base station 105 may be movable and therefore provide communication coverage for a moving geographic coverage area 110. In some examples, different geographic coverage areas 110 associated with different technologies may overlap, but the different geographic coverage areas 110 may be supported by the same base station 105. In other examples, the overlapping geographic coverage areas 110 associated with different technologies may be supported by different base stations 105. The wireless communications system 100 may include, for example, a heterogeneous network in which different types of the base stations 105 provide coverage for various geographic coverage areas 110 using the same or different radio access technologies.

The wireless communications system 100 may support synchronous or asynchronous operation. For synchronous operation, the base stations 105 may have similar frame timings, and transmissions from different base stations 105 may be approximately aligned in time. For asynchronous operation, the base stations 105 may have different frame timings, and transmissions from different base stations 105 may, in some examples, not be aligned in time. The techniques described herein may be used for either synchronous or asynchronous operations.

Some UEs 115, such as MTC or IoT devices, may be low cost or low complexity devices and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay such information to a central server or application program that makes use of the information or presents the information to humans interacting with the application program. Some UEs 115 may be designed to collect information or enable automated behavior of machines or other devices. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples, half-duplex communications may be performed at a reduced peak rate. Other power conservation techniques for the UEs 115 include entering a power saving deep sleep mode when not engaging in active communications, operating over a limited bandwidth (e.g., according to narrowband communications), or a combination of these techniques. For example, some UEs 115 may be configured for operation using a narrowband protocol type that is associated with a defined portion or range (e.g., set of subcarriers or resource blocks (RBs)) within a carrier, within a guard-band of a carrier, or outside of a carrier.

The wireless communications system 100 may be configured to support ultra-reliable communications or low-latency communications, or various combinations thereof. For example, the wireless communications system 100 may be configured to support ultra-reliable low-latency communications (URLLC) or mission critical communications. The UEs 115 may be designed to support ultra-reliable, low-latency, or critical functions (e.g., mission critical functions). Ultra-reliable communications may include private communication or group communication and may be supported by one or more mission critical services such as mission critical push-to-talk (MCPTT), mission critical video (MCVideo), or mission critical data (MCData). Support for mission critical functions may include prioritization of services, and mission critical services may be used for public safety or general commercial applications. The terms ultra-reliable, low-latency, mission critical, and ultra-reliable low-latency may be used interchangeably herein.

In some examples, a UE 115 may also be able to communicate directly with other UEs 115 over a device-to-device (D2D) communication link 135 (e.g., using a peer-to-peer (P2P) or D2D protocol). One or more UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some examples, groups of the UEs 115 communicating via D2D communications may utilize a one-to-many (1:M) system in which each UE 115 transmits to every other UE 115 in the group. In some examples, a base station 105 facilitates the scheduling of resources for D2D communications. In other cases, D2D communications are carried out between the UEs 115 without the involvement of a base station 105.

In some systems, the D2D communication link 135 may be an example of a communication channel, such as a sidelink communication channel, between vehicles (e.g., UEs 115). In some examples, vehicles may communicate using vehicle-to-everything (V2X) communications, vehicle-to-vehicle (V2V) communications, or some combination of these. A vehicle may signal information related to traffic conditions, signal scheduling, weather, safety, emergencies, or any other information relevant to a V2X system. In some examples, vehicles in a V2X system may communicate with roadside infrastructure, such as roadside units, or with the network via one or more network nodes (e.g., base stations 105) using vehicle-to-network (V2N) communications, or with both.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the base stations 105 associated with the core network 130. User IP packets may be transferred through the user plane entity, which may provide IP address allocation as well as other functions. The user plane entity may be connected to the network operators IP services 150. The operators IP services 150 may include access to the Internet, Intranets), an IP Multimedia Subsystem (IMS), or a Packet-Switched Streaming Service.

Some of the network devices, such as a base station 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPS). Each access network transmission entity 145 may include one or more antenna panels. In some configurations, various functions of each access network entity 140 or base station 105 may be distributed across various network devices (e.g., radio heads and ANCs) or consolidated into a single network device (e.g., a base station 105).

The wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (e.g, less than 100 kilometers) compared to transmission using the smaller frequencies and longer waves of the high frequency (HF) or very high frequency (VHF) portion of the spectrum below 300 MHz.

The wireless communications system 100 may also operate in a super high frequency (SHF) region using frequency bands from 3 GHz to 30 GHz, also known as the centimeter band, or in an extremely high frequency (EHF) region of the spectrum (e.g., from 30 GHz to 300 GHz), also known as the millimeter band. In some examples, the wireless communications system 100 may support millimeter wave (mmW) communications between the UEs 115 and the base stations 105, and EHF antennas of the respective devices may be smaller and more closely spaced than UHF antennas. In some examples, this may facilitate use of antenna arrays within a device. The propagation of EHF transmissions, however, may be subject to even greater atmospheric attenuation and shorter range than SHF or UHF transmissions. The techniques disclosed herein may be employed across transmissions that use one or more different frequency regions, and designated use of bands across these frequency regions may differ by country or regulating body.

The wireless communications system 100 may utilize both licensed and unlicensed radio frequency spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. When operating in unlicensed radio frequency spectrum bands, devices such as the base stations 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A base station 105 or a. UE 115 may be equipped with multiple antennas, which may be used to employ techniques such as transmit diversity, receive diversity, multiple-input multiple-output (MIMO) communications, or beamforming. The antennas of a base station 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations. Additionally or alternatively, an antenna panel may support radio frequency beamforming for a signal transmitted via an antenna port.

The base stations 105 or the UEs 115 may use MIMO communications to exploit multipath signal propagation and increase the spectral efficiency by transmitting or receiving multiple signals via different spatial layers. Such techniques may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry bits associated with the same data stream (e.g., the same codeword) or different data streams (e.g., different codewords). Different spatial layers may be associated with different antenna ports used for channel measurement and reporting. MIMO techniques include single-user MIMO (SU-MIMO), where multiple spatial layers are transmitted to the same receiving device, and multiple-user MIMO (MU-MIMO), where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105, a UE 115) to shape or steer an antenna beam (e.g., a transmit beam, a receive beam) along a spatial path between the transmitting device and the receiving device. Beamforming may be achieved 1w combining the signals communicated via, antenna elements of an antenna array such that some signals propagating at particular orientations with respect to an antenna array experience constructive interference while others experience destructive interference. The adjustment of signals communicated via, the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

A base station 105 or a UE 115 may use beam sweeping techniques as part of beam forming operations. For example, a base station 105 may use multiple antennas or antenna arrays (e.g., antenna panels) to conduct beamforming operations for directional communications with a UE 115. Some signals (e.g., synchronization signals, reference signals, beam selection signals, or other control signals) may be transmitted by a base station 105 multiple times in different directions. For example, the base station 105 may transmit a signal according to different beamforming weight sets associated with different directions of transmission. Transmissions in different beam directions may be used to identify (e.g., by a transmitting device, such as a base station 105, or by a receiving device, such as a UE 115) a beam direction for later transmission or reception by the base station 105.

Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based on a signal that was transmitted in one or more beam directions. For example, a UE 115 may receive one or more of the signals transmitted by the base station 105 in different directions and may report to the base station 105 an indication of the signal that the UE 115 received with a highest signal quality or an otherwise acceptable signal quality.

In some examples, transmissions by a device (e.g., by a base station 105 or a UE 115) may be performed using multiple beam directions, and the device may use a combination of digital precoding or radio frequency beamforming to generate a combined beam for transmission (e.g., from a base station 105 to a UE 115). The UE 115 may report feedback that indicates precoding weights for one or more beam directions, and the feedback may correspond to a configured number of beams across a system bandwidth or one or more sub-bands. The base station 105 may transmit a reference signal (e.g., a cell-specific reference signal (CRS), a channel state information reference signal (CSI-RS)), which may be precoded or unprecoded. The UE 115 may provide feedback for beam selection, which may be a precoding matrix indicator (PMI) or codebook-based feedback (e.g., a multi-panel type codebook, a linear combination type codebook, a port selection type codebook). Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115) or for transmitting a signal in a single direction (e.g., for transmitting data to a receiving device).

A receiving device (e.g., a UE 115) may try multiple receive configurations (e.g., directional listening) when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets (e.g., different directional listening weight sets) applied to signals received at multiple antenna elements of an antenna array, or by processing received signals according to different receive beamforming weight sets applied to signals received at multiple antenna elements of an antenna array, any of which may be referred to as "listening" according to different receive configurations or receive directions. In some examples, a receiving device may use a single receive configuration to receive along a single beam direction (e.g., when receiving a data signal). The single receive configuration may be aligned in a beam direction determined based on listening according to different receive configuration directions (e.g., a beam direction determined to have a highest signal strength, highest SNR, or otherwise acceptable signal quality based on listening according to multiple beam directions).

The wireless communications system 100 may be a packet-based network that operates according to a layered protocol stack. In the user plane, communications at the bearer or Packet Data Convergence Protocol (PDCP) layer may be IP-based, A Radio Link Control (RLC) layer may perform packet segmentation and reassembly to communicate over logical channels. A Medium Access Control (MAC) layer may perform priority handling and multiplexing of logical channels into transport channels. The MAC layer may also use error detection techniques, error correction techniques, or both to support retransmissions at the MAC layer to improve link efficiency. In the control plane, the Radio Resource Control (RRC) protocol layer may provide establishment, configuration, and maintenance of an RRC connection between a UE 115 and a base station 105 or a core network 130 supporting radio bearers for user plane data. At the physical layer, transport channels may be mapped to physical channels.

The UEs 115 and the base stations 105 may support retransmissions of data to increase the likelihood that data is received successfully. Hybrid automatic repeat request (HARQ) feedback is one technique for increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., low signal-to-noise conditions). In some examples, a device may support same-slot HARQ feedback, where the device may provide HARQ feedback in a specific slot for data received in a previous symbol in the slot. In other cases, the device may provide HARQ feedback in a subsequent slot, or according to some other time interval.

A UE 115 may operate in a DC configuration, and may receive signals from more than one RAT. The UE 115 may measure a first signal power for a first RAT and a second signal power for a second RAT. The UE may receive these signals from one or more base stations 105. The UE 115 may determine a common gain state for the first RAT and the second RAT based on the first signal power and the second signal power. The UE 115 may then apply the common gain state to a first receiver chain within the UE 115 for the first RAT and to a second receiver chain within the UE 115 for the second RAT, where the first receiver chain and the second receiver chain share at least one shared LNA. The UE 115 may determine a common gain state for the first RAT and the second RAT based on inputting the first signal power and the second signal power into an aggregation function.

Figure 2:
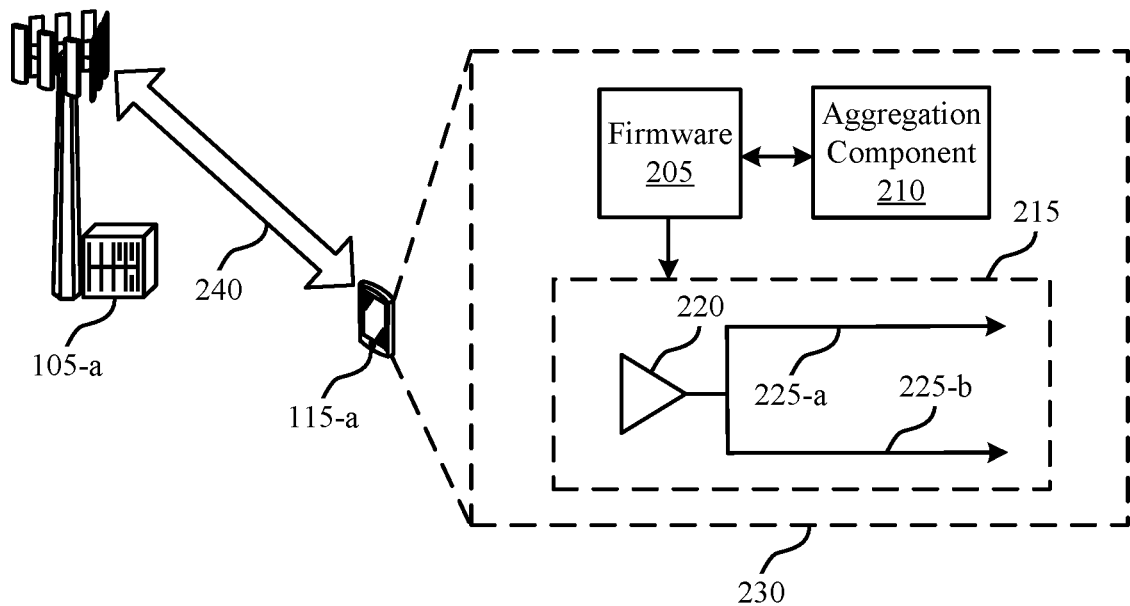
FIG. 2 illustrates an example of a wireless communications system that supports common automatic gain control across multiple radio access technologies in accordance with aspects of the present disclosure.

FIG. 2 illustrates an example of a wireless communications system 200 that supports common automatic gain control across multiple radio access technologies in accordance with aspects of the present disclosure. In some examples, wireless communications system 200 may implement aspects of wireless communication system 100. UE 115-a may operate in a DC configuration in wireless communications system 200. UE 115-a may receive and transmit communications according to multiple RATs, such as LTE and NR. UE 115-a may receive communications from the multiple RATs from one or more base stations 105, such as base station 105-a. UE 115-a may communicate with a base station 105-a over signaling 240 and may receive communications in multiple RATs over signaling 240.

UE 115-a may include components 240, which may be internal to UE 115-a. Component 240 may include firmware 205, aggregation component 210, and circuitry 215. Circuitry 215 may include one or more LNAs 220 and receive chains 225. In this case, receive chain 225-a may be for a first RAT (e.g., LTE), and receive chain 225-b may be for a second RAT (e.g., NR). Receive chains 225 may share LNA 220. LNA 220 may be an internal LNA or an external LNA.

Firmware 205 may be an example of common firmware and radio-frequency (RF) components shared between two RATs, which may include one or more RF drivers. UE 115-a may receive signaling from two RATs at one or more antennas. The signals may go through the shared LNA 220 or front-end amplifier before splitting into two receive chains 225 which may include further amplification, filtering, and conversion (e.g., analog-to-digital conversion (ADC)) components. Firmware 205 may operate and control components of the circuity, as well as control aggregation component 210.

UE 115-a may receive signals from two RATs. The signals may include RSSI information, and other signal quality indication information. Based on RSSI or other information for each RAT signal, aggregation component 210 may determine a common gain that firmware 205 may apply to bath receive chains 225. The common gain application may mitigate potential issues caused by shared LNA 220, such as incorrect gain state, incorrect reporting measurements, mobility issues and call drops, inability to support particular communication features, and other problems.

The common gain may be determined and applied for SSIM operations, and also for MSIM communications, Common AGC using an aggregated common gain may be applied in a number of EN-DC cases where the UE has a shared LNA between receive chains of different RATs. For example, common gain may be applied in cases where a particular RAT has ongoing activity (e.g., active). Some cases may include those described in Table 1, which may be applicable for SSIM configurations, or cases where signals from different RATs are received over the same SIM. Table 1 may show example configurations where the two RATs are NR and LTE, but a shared LNA with an aggregated common gain may be applied for other types of RAT combinations as well.

TABLE 1

| EN-DC AGC Mode and RAT Status | | |
|---|---|---|
| EN-DC AGC Mode | LTE | NR |
| 0 (LTE Only) | Active | Inactive |
| 1 (DC Active) | Active (Connected Streaming) | Active (Connected Streaming) |
| 2 (Connected Gap in LTE) | Active (with LTE-to-everything communications) | Active (Connected Streaming with concurrent gap) |
| 3 (Connected Gap in NR) | Active (Connected Streaming with concurrent gap) | Active (with NR-to-NR communications) |
| 4 (DC Active with CDRx) | cDRX | cDRX |
| 5 (DC Active with CA on NR/LTE) | Primary component carriers (PCC)/Secondary component carriers (SCCs) Active (with one or more deactivated SCell Measurement or Search) | PCC/SCCs Active (with one or more deactivated SCell Measurement or Search) |

The functions of firmware 205 operating aggregation component 210 may include common firmware or RF actions for steady state operations. These common firmware and RF actions may occur periodically or occasionally, and may include cases where one RAT (e.g., LTE) generates filtered aggregated RSSI for all carriers associated with the RAT (e.g., all LTE carriers) with an EN-DC group. The firmware for the second RAT (e.g., NR) may aggregate information across the CCs in the group (e.g., the NR group) and across 1 ms slots, and the firmware may filter this information, including filtering across multiple slots.

Common firmware or RF drivers may aggregate RSSI information according to a particular function. Firmware component 205 may operate aggregation component 210 to determine the common gain to apply. For example, aggregation component 210 may aggregate the RSSI data from each RAT according to an equation. For example, the aggregation equation may be modeled by $$RSSI = F(\alpha \cdot (filtered_{NR_{RSSI}}) + \beta (filtered_{LTE_{RSSI}})).$$

Thus, the RSSI contribution from each RAT may be weighted according to importance, or other factors. In this function, RSSI may also be taken directly and aggregated without a scaling component (e.g., a case where $\alpha$ and $\beta$ are both 1).

The aggregation function performed by aggregation component 210 may also be a function that determines the maximum gain state (e.g., either the LTE gain state or the NR gain state, based on which is higher) and applies that maximum determined gain state as the common gain state. The aggregation function may also be a minimum function, an averaging function, or another function. Further, the aggregation function may run based on other measurements besides RSSI (e.g., signal to interference plus noise ratio (SINR), SNR, reference signal received power (RSR P), reference signal received quality (RSRQ), or another measurement).

With an aggregated RSSI and a corresponding common gain, firmware 205 operating common RF software module across both receive chains 225 may establish the common gain state to be applied for each antenna for each RAT. Firmware 205 may operate functions of a software module and may apply the common gain state for each receive antenna for each RAT. In cases where two RATs are in a shared RF mode, the described aggregation flow may be applicable even to antenna and receive paths that do not necessarily share the LNA path with the other RAT. For example, the aggregation and common gain state application by firmware 205 may be applied in cases of high interference between different RATs, or other cases where the LNA or front-end RF component is not shared, and each RAT receive path has a separate LNA.

Firmware 205 may handle further requests from each RAT and corresponding network or operator. For example, one RATs may request to freeze the gain state for both receive paths for both RATs. Firmware 205 may accept or reject such a request. Firmware 205 may also have the ability to apply a freeze request for a particular time period after which the common gain state may be applied again. One or more RATs may also have the ability to override a common gain state the apply a gain state optimal for only one RAT. This may be applicable in different modes, and also in cases of high priority or low latency communication from one RAT.

Additionally, common gain may be aggregated and applied in MSIM cases. MSIM shared RF cases may include cases with concurrent band combinations across SIMS of different receive paths. A UE may include a shared LNA across RATs, but the signals for the different RATs (e.g., LTE and NR) may come from different networks or subscriber stations. For example, a UE 115 may be configured to operate according to two different SIMs, such as a first NR SIM and a second LTE SIM.

A concurrent band combination in a MSIM scenario may include a case where a first SIM may correspond to a standalone NR band n41 (corresponding to frequency band 2500 MHz) and a second SIM may correspond to LTE band B41 (also corresponding to frequency band 2500 MHz). A NR SIM may include transmission components, primary receive chain (PRX) components, diversity receive chain (DRX) components, and two MIMO components, MIMO1 and MIMO2.

An LTE SIM may include MIMOs, MIMO1 and MIMO2. One or both of the LTE SIM or the NR SIM may be in an idle mode. The idle mode may mean that the SIM is inactive, or that it is performing frequency scanning, acquisition, measurements, PBCH decoding, SI reading, page decoding, cell reselection, background public mobile network (BPLMN) searches, inter-frequency searches or measurements, inter-RAT (IRAT) searches or measurements, or in another non-connected mode. The aggregation function to apply a common gain may apply similarly in MSIM cases as in SSIM cases. The firmware of the UE 115 operating according to the two SIMs may introduce common RF components that aggregate, resolve, and reconcile requests and usage from both RATs. The firmware may derive a common gain state based on the aggregation of requests by the two SIMs. The aggregated common gain state may be communicated to both RATs and other modules within RATs to maintain consistency across settings. The shared LNA gain state may be shared by the UE 115 with multiple SIMs during a concurrency procedure.

FIGS. 3A and 3B illustrate examples of circuit diagrams 301 and 302 that support common automatic gain control across multiple radio access technologies in accordance with aspects of the present disclosure. In some examples, circuit diagrams 301 and 302 may implement aspects of wireless communication systems 100 and 200. Circuit diagrams 301 and 302 may illustrate examples of shared LNA circuitry for the hardware of a UE 115. Circuit diagram 301 may illustrate an example of an external shared LNA, and circuit diagram 302 may illustrate an example of circuitry with an internal shared LNA.

In either circuit diagram 301 or 302, circuitry of a UE 115 may receive, with an antenna 305, incoming signals from one or more RATs. In the case of DC applications, antenna 305 may receive incoming signals from at least two RATs. The signals may be received at the same time, at overlapping times, or at non-overlapping times.

The received signals may pass through front end modules 310, and proceed to RF modules 315. In circuit diagram 301, RF module 315-$a$ may include an internal shared LNA 320-$a$ or amplifier. Shared LNA 320-$a$ may then amplify the signals, and pass the signals on to components of module 325-$a$. The aggregated common gain may be applied after shared LNA 320-$a$. Module 325-$a$ may include LNAs 320-$b$ and 320-$c$, which may be unshared LNA 320$s$.

In circuit diagram 302, the received signals may pass through an external LNA 320-$d$ which may be a shared LNA, and the signals may process from external shared LNA 320-$d$ to an internal shared LNA 320-$e$. Internal shared LNA 320-$e$ may also amplify the signals for both receive chains from both RATs. The aggregated common gain may be applied after internal LNA 320-$e$.

In either case of circuit diagram 301 or 302 (and in either case of a shared external LNA 320 or a shared external and shared internal LNA 320), after application of the common gain, the signal may proceed through a summer or multiplier 330, so a series of filters 335. After filtering, the signal may undergo analog-to-digital conversion by an ADC 340. This signal may then be in a wide band frequency, and may the go through a second summer of multipliers 330 to result in a narrowband. NR signal for different CCs.

Figure 4A:
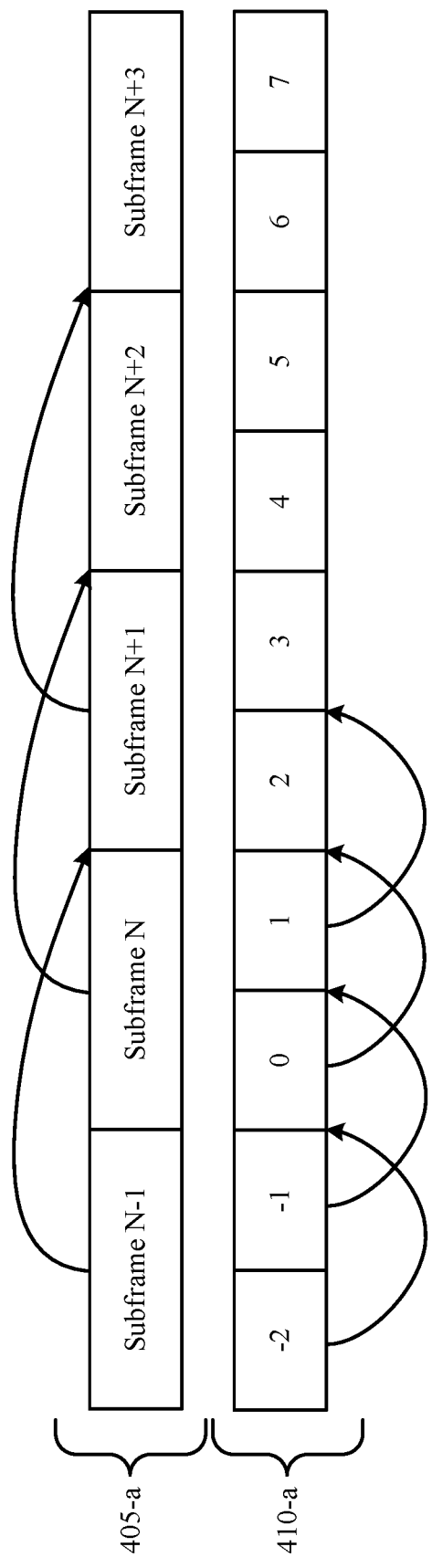
FIGS. 4A and 4B illustrates examples of slot configurations that support common automatic gain control across multiple radio access technologies in accordance with aspects of the present disclosure.
Figure 4B:
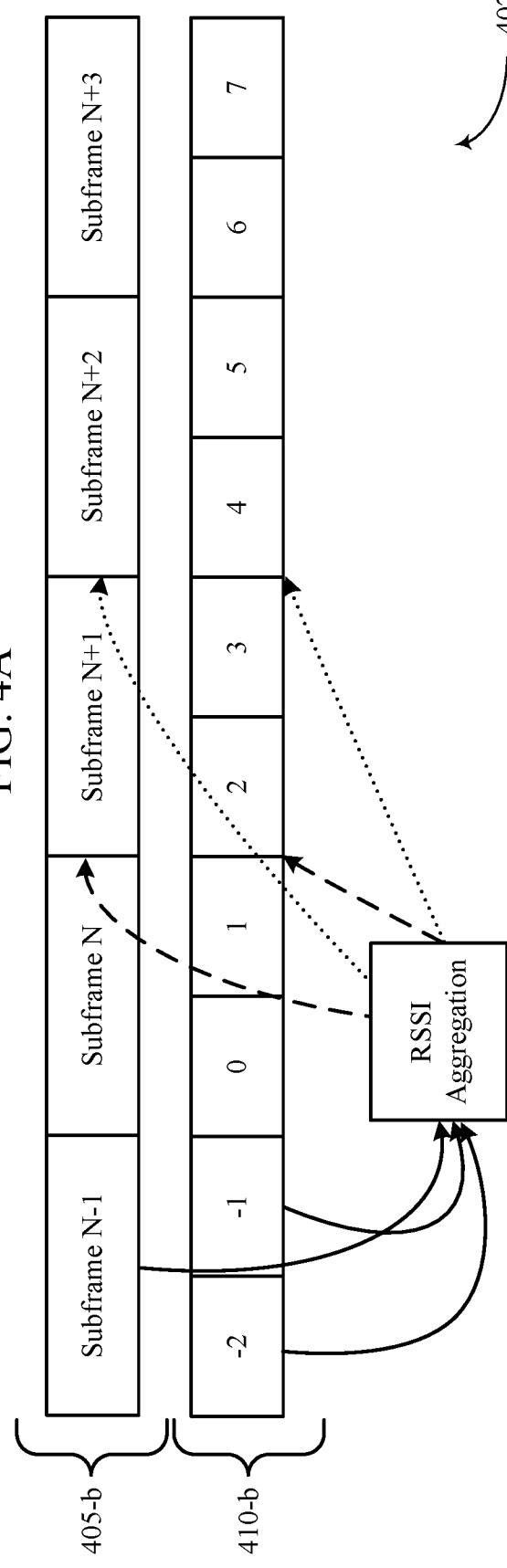

FIGS. 4A and 4B illustrate examples of slot configurations 401 and 402 that support common automatic gain control across multiple radio access technologies in accordance with aspects of the present disclosure. In some examples, slot configurations 401 and 402 may implement aspects of wireless communication systems 100 and 200. A UE 115 may receive data streams from two different RATs. Slot configuration 401 may illustrate an example of how a UE 115 may apply different gains in cases without the common gain aggregation procedure as described herein. Without a common gain aggregation procedure, firmware of a UE 115 may determine a gain to apply to a receive data chain solely based on information (e.g., RSSI) corresponding to that particular data chain. For example, receive chain 405-$a$ may illustrate an example of a LTE receive chain. The LTE receive chain may include a number of subframes. Firmware of the UE 115 may receive data quality information, such as RSSI during subframe N−1. The firmware may determine a gain based on data corresponding to subframe N-1 and apply that gain to subframe. The firmware may then determine a gain based on subframe N and apply that gain to subframe N+2, and so on.

Receive chain 410-a may illustrate an example of a second receive chain, such as a NR receive chain. Without aggregated common gain, the firmware may receive signal quality information for slot "–2", and determine a gain based on that information. the firmware may then apply that gain to slot "0". The firmware may then determine a gain based on information received corresponding to slot "–1", and the firmware may apply that gain to slot "1", and so on.

In case where a UE 115 has a shared LNA for receive chains 405-a and 410-a, the individualized gain for each receive chain may lead to a number of issues. These issues may include performance losses such as glitches, a poor SNR leading to poor throughput and coverage loss, and other losses and inefficiencies. Further, in cases where different gain states are applied for a shared LNA, the UE may also determine incorrect measurements for reporting, experience mobility issues and call drops, have an inability to support features such as CDRx and also have an inability to support optimal performance for MSIM shared LNA cases for particular band combinations.

In order to avoid these issues, firmware of a UE 115 may perform an aggregation function to determine a common gain between receive chains of different RATS. Slot configuration 402 may illustrate an example of a common gain application. Receive chain 405-b may be an example of a receive chain for a first RAT (e.g., LTE), and receive chain 410-b may be an example of a receive chain for a second RAT (e.g., NR). In order to perform common gain aggregation, firmware of a UE 115 may receive RSSI and other signal quality data from both RATs. For example, the firmware of the UE 115 may receive RSSI in subframe N–1 for receive chain 405-b corresponding to a first RAT and may also receive RSSI in slots "–2" and "–1" for receive chain 410-b corresponding to the second RAT. The firmware may combine data from slots "–1" and "–2" as a part of an aggregation function.

The firmware may perform RSSI aggregation in order to determine a common gain to apply between both receive chains 405-b and 410-b. This may be applicable in cases where the receive chains 405-b and 410-b share an LNA, and in other cases where a common gain may be used. The common gain determined by the aggregation function may be applied at subframes N and slot "2". In other cases, the common gain may be applied at a next slot, for example and subframe N+2 or slot "4". This may occur in cases where the gain is applied based on a delay, such as a 1 ms delay.

The aggregation function may include common firmware or RF actions in a steady state. These common firmware and RF actions may occur periodically or occasionally, and may include cases where a first RAT (e.g., LTE) generates filtered aggregated RSSI for all carriers of that RAT with an EN-DC group. For the second RAT (e.g., NR), the firmware may aggregate information across the CCs in the second RAT and across 1 ms slots, and the firmware may filter this information.

The aggregation function may be an averaging function, a summing function, a function that determines the maximum gain state (e.g., either the LTE gain stale or the NR gain state) and applies that maximum determine gain state as the common gain state, or another type of function. Further, the aggregation function may run based on other measurements besides RSSI (e.g., SINR, SNR, RSRP, or another measurement).

FIGS. 5A, 5B, and 5C illustrate examples of slot diagrams 501, 502, and 502 that supports common automatic gain control across multiple radio access technologies in accordance with aspects of the present disclosure. In some examples, slot diagrams 501, 502, and 503 may implement aspects of wireless communication system 100. Slot diagrams 501, 502, and 503 may illustrate examples of further common gain aggregation operations. For example, the firmware as described herein may handle further requests from each separate RAT. Receive chain 505-c may be a continuation of receive chain 505-a, and receive chain 505-e may be a continuation of receive chain 505-c. Receive chain 505-d may be a continuation of receive chain 505-b, and receive chain 505-f may be a continuation of receive chain 505-d. Some slots or subframes of receive chains 505 may be inactive, and some slots or subframes may correspond to a wakeup slots or subframe, depending on the status of the UE 115 and the signaling of the RAT corresponding to the receive chain 505.

Slot diagram 501 may illustrate a timing process for a common gain application. In this case, receive chain 505-a may be an example of a receive chain for a first RAT (e.g., LTE) and receive chain 505-b may be an example of a receive chain for a second RAT (e.g., NR). Line 510-a may represent firmware (e.g., LTE ML1) for receive chain 505-a, and lines 510 may represent communications with firmware (e.g., NR L1) for receive chain 505-a. At 515-a, firmware 510 may receive signaling information from receive chain 505-a for a certain wakeup slot. At 520-a, firmware 510 may receive signaling information from receive chain 505-b. At 525, firmware 510 may apply the common gain to a subsequent slot of receive chain 505-b. At 530, firmware 510 may apply the common gain to a subsequent slot of receive chain 505-b. Firmware 510 may receive further signaling at 515-b, and firmware 510 may also receive further signaling information at 520-b. Firmware 510 may determine an updated common gain based on additional signaling. The updated common gain may be applied to subsequent slots.

In some cases, one or more RATs may request to freeze the gain state for both receive chains for both RATs. The firmware module may accept or reject such a request. The firmware module may also have the ability to apply a freeze request for a particular time period after which the common gain state may be applied again. One or more RATs may also have the ability to override a common gain state the apply a gain state optimal for only one RAT. This may be applicable in different mode cases, and also in cases of high priority or low latency communication from one RAT. This freeze process may be shown in slot diagram 502.

For example, receive chain 505-c may be a continuation of receive chain 505-a, and receive chain 505-d may be a continuation of receive chain 505-b. At 535-a, firmware 510 may apply the updated common gain based on signaling 515-b and 520-b, based on an aggregation function completed with firmware 510 and 510. At 545-a, firmware 510 may receive further updated signaling, such as RSSI. At 540-a, firmware 510 may apply the updated common gain based on signaling 515-b and 520-b. At 550-a, firmware 510 may receive updated RSSI or other signaling information. Firmware 510 may receive a request for a freeze in signaling from the RAT corresponding to 505-d (e.g., NR). The freeze request may be for a particular number of slots or subframes. At 540-b, firmware 510 may apply an updated common gain to bath receive chain 505-a and 505-b. At 555, firmware 510 may determine not to apply the update common gain based on the freeze request. At 545-b and 550-b, firmware 510 may continue to receive signaling to aggregate updated common gains. Firmware 510 may determine not to apply update common gains to receive chain 505-*c* until the time indicated in the receive request has passed.

Additionally or alternatively, the RAT corresponding to receive chain 505-*e* may indicate a freeze request. This procedure may be shown in slot diagram 503. In this case, firmware 510 may apply an update common gain 555 to receive chain 505-*e*. At 560, firmware 510 may determine not to apply the updated common gain to receive chain 505-*f* based on the received request. At 565 and 570, firmware 510 may continue to receive signaling information with which to aggregate an updated common gain for future usage.

Firmware 510 may also handle gain states across IRAT gaps, in order to determine a gain state before and after a gap that is common to both RATs. An IRAT gap opening may also be an example of an IRAT gap. The handling of gain states across IRAT gaps may include handling a first gain state for the first RAT and a second gain state for the second RAT, within a threshold time of a common IRAT gap opening where this first RAT and the second RAT are inactive. The gap may occur at a time with no communications to or from either RAT, for example, from 545-*b* to 555. Additionally, the firmware may handle gain states when only one RAT is active, for example from 525 to 515-*b*. This may occur in cases where the measurement gap timing advance (MGTA) is 0.5, or in other non-common gap cases. The firmware 510 may set a special gain state in cases where only one RAT is active for a period of time. For example, firmware 510 may set a special gain state at 525 when only the RAT corresponding to receive chain 505-*a* is active, and receive chain 505-*b* is inactive.

In addition to common gain state application, the common firmware module may share the determined gain state to different RAT-specific components, which may be internal to the firmware or to other hardware or software of the UE 115. This internal communication mar aid the RAT-specific component in evaluating optimal digitally controlled variable gain amplifiers (DVGA) gains for signals from the RAT, as well as optimal RF or digital tracking receiver (DTR) settings to handle phase compensation, and to address DC or residual sideband (RSB) and other front end impacts that are dependent on the gain state (e.g., the common gain state applied for signaling from both RATs).

Figure 6:
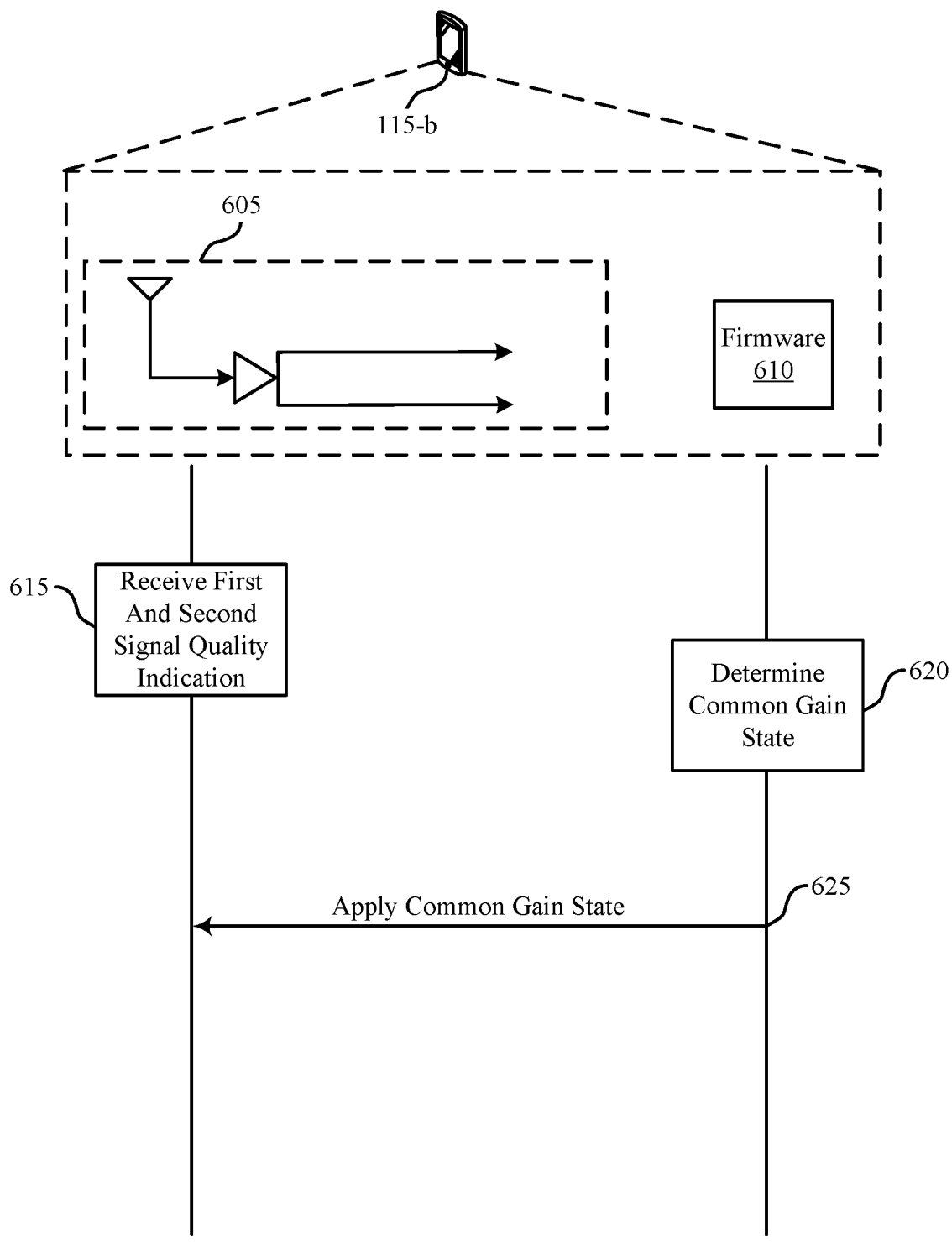
FIG. 6 illustrates an example of a process flow that supports common automatic gain control across multiple radio access technologies in accordance with aspects of the present disclosure.

FIG. 6 illustrates an example of a process flow 600 that supports common automatic gain control across multiple radio access technologies in accordance with aspects of the present disclosure. In some examples, process flow 600 may implement aspects of wireless communication systems 100 and 200. Antenna and LNA module 605 and firmware 610 may be internal components to UE 115-*b*. UE 115-*b* may receive signaling via the antenna and LNA module 605 from two RATs. The LNA may be a LNA shared between the receive chains of each RAT.

UE 115-*b* may measure a first signal power and a second signal power. This may occur at antenna and LNA module 605. Antenna and LNA module 605 may measure, at 615, a first signal power for a first RAT and a second signal power for a second RAT different from the first RAT. Antenna and LNA module 605 may measure first signal strength indicators that are based on measurements from one or more carriers associated with the first RAT. Antenna and LNA module 605 may measure second signal strength indicators that are based on measurements from one or more carriers associated with the second RAT, where the first signal power and the second signal power are based on first and second signal strength indicators.

At 620, firmware 610 may determine a common gain state for the first RAT and the second RAT based on the first signal power and the second power. The aggregation function may include a weighted average of the first signal power and the second signal power. The weighted average of the first signal power and the second signal power may include a weighted average of signal powers for a set of carriers associated with the first RAT, the second RAT, or both. The aggregation function may also include a maximum of a first gain state associated with the first signal power, and a second gain state associated with the signal power. Firmware 610 may aggregate the first signal strength indicators across the one or more carriers associated with the first RAT to generate first aggregated signal strength indicators. Firmware 610 may also aggregate the second signal strength indicators across the one or more carriers associated with the second RAT to generate second aggregated signal strength indicators. The aggregation function may be further based on a gain state for the first, the second RAT, or both. In some cases, UE 115-*b* may includes a first SIM for the first RAT and a second SIM for the second RAT.

In some cases, an antenna in antenna and LNA module 605 of UE 115-*b* may receive a request to freeze the common gain state, for a duration, based on a first gain state for the first RAT and a second gain state for the second RAT. Firmware 610 of UE 115-*b* may apply a freeze to the common gain state for the duration based on the request. Firmware 610 may also apply a subsequent gain state to the first receiver chain and the second receiver chain after the. In some cases, UE 115-*b* may reject the request to freeze the common gain state. In some cases, firmware 610 may override the common gain state with a different gain state that is selected for the first RAT or the second RAT.

Firmware 610 of UE 115-*b* may identify an IRAT gap, wherein the first RAT and the second RAT are inactive. Firmware 610 may determine a first common gain state outside of the IRAT gap and a second common gain state during the IRAT gap. Firmware 610 may also handle a first gain state for the first RAT and a second gain state for the second RAT within a threshold time of a common IRAT gap opening wherein the first RAT and the second RAT are inactive. The determination of the common gain state may be based on configuring one or more simultaneous measurements of the first RAT and the second RAT using the shared LNA.

At 625, firmware 610 of UE 115-*b* may apply the common gain state to a first receive chain within UE 115-*b* (e.g., within module 610) and to a second receiver chain within UE 115-*b* for the second RAT, wherein the first receiver chain and the second receiver chain share at least one shared LNA (e.g., the LNA of antenna and LNA module 605). Firmware 610 may apply the common gain state to a third receive chain within UE 115-*b*, where the third receiver chain may include a separate LNA that is different from the shared. LNA.

Figure 7:
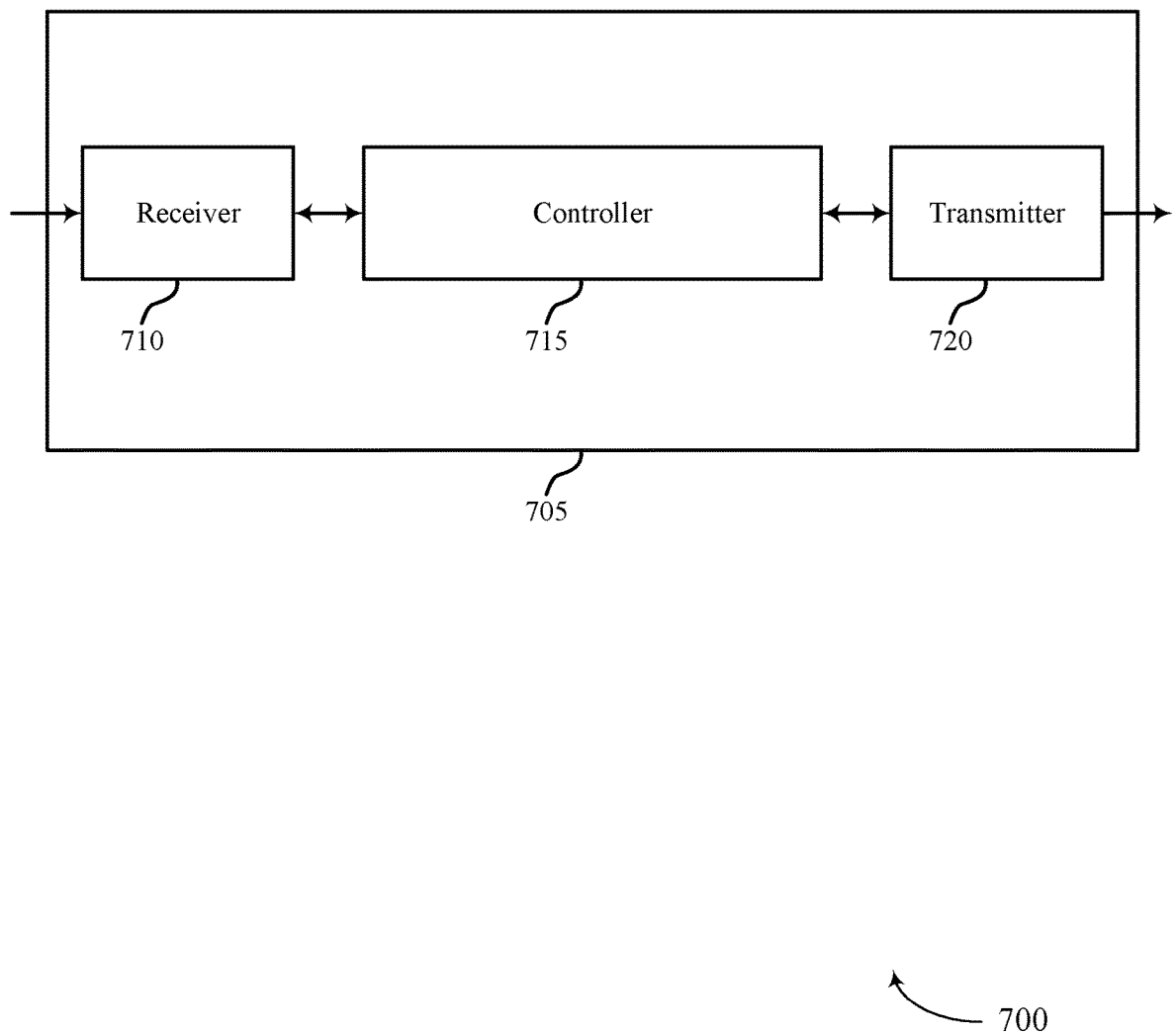
FIGS. 7 and 8 show block diagrams of devices that support common automatic gain control across multiple radio access technologies in accordance with aspects of the present disclosure.

FIG. 7 shows a block diagram 700 of a device 705 that supports common automatic gain control across multiple radio access technologies in accordance with aspects of the present disclosure. The device 705 may be an example of aspects of a UE 115 as described herein. The device 705 may include a receiver 710, a controller 715, and a transmitter 720. The device 705 may also include a processor. Each of these components may be in communication with one another (e.g., via one or more buses).

The receiver 710 may receive information such as packets, user data, or control information associated with various information channels (e.g., control channels, data channels, and information related to common automatic gain control across multiple radio access technologies, etc.). Information may be passed on to other components of the device 705. The receiver 710 may be an example of aspects of the transceiver 1020 described with reference to FIG. 10. The receiver 710 may utilize a single antenna or a set of antennas.

The controller 715 may measure a first signal power for a first RAT and a second signal power for a second RAT different from the first RAT, determine a common gain state for the first RAT and the second RAT based on the first signal power and the second signal power, and apply the common gain state to a first receiver chain within the UE for the first RAT and to a second receiver chain within the UE for the second RAT, where the first receiver chain and the second receiver chain share at least one shared LNA. The controller 715 may be an example of aspects of the controller 1010 described herein.

The controller 715, or its sub-components, may be implemented in hardware, code (e.g., software or firmware) executed by a processor, or any combination thereof. If implemented in code executed by a processor, the functions of the controller 715, or its sub-components may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described in the present disclosure.

The controller 715, or its sub-components, may be physically located at various positions, including being distributed such that portions of functions are implemented at different physical locations by one or more physical components. In some examples, the controller 715, or its sub-components, may be a separate and distinct component in accordance with various aspects of the present disclosure. In some examples, the controller 715, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 720 may transmit signals generated by other components of the device 705. In some examples, the transmitter 720 may be collocated with a receiver 710 in a transceiver module. For example, the transmitter 720 may be an example of aspects of the transceiver 1020 described with reference to FIG. 10. The transmitter 720 may utilize a single antenna or a set of antennas.

In some examples, the controller 715 described herein may be implemented as a chipset of a wireless modem, and the receiver 710 and the transmitter 720 may be implemented as sets of analog components (e.g., amplifiers, filters, phase shifters, antennas, etc.) The wireless modem may obtain and decode signals from the receiver 710 over a receive interface, and may output signals for transmission to the transmitter 720 over a transmit interface.

The actions performed by the controller 715 as described herein may be implemented to realize one or more potential advantages. One implementation may allow a UE 115 to save power and increase battery life by enabling the UE 115 to operate efficiently in DC operations with a shared LNA. The controller 715 may operate firmware that determines common gain to increase UE capabilities and decrease power loss and other losses. Another implementation may provide improved quality and reliability of service by enabling the UE 115 to void glitches and improve signal measurement reliability.

Figure 8:
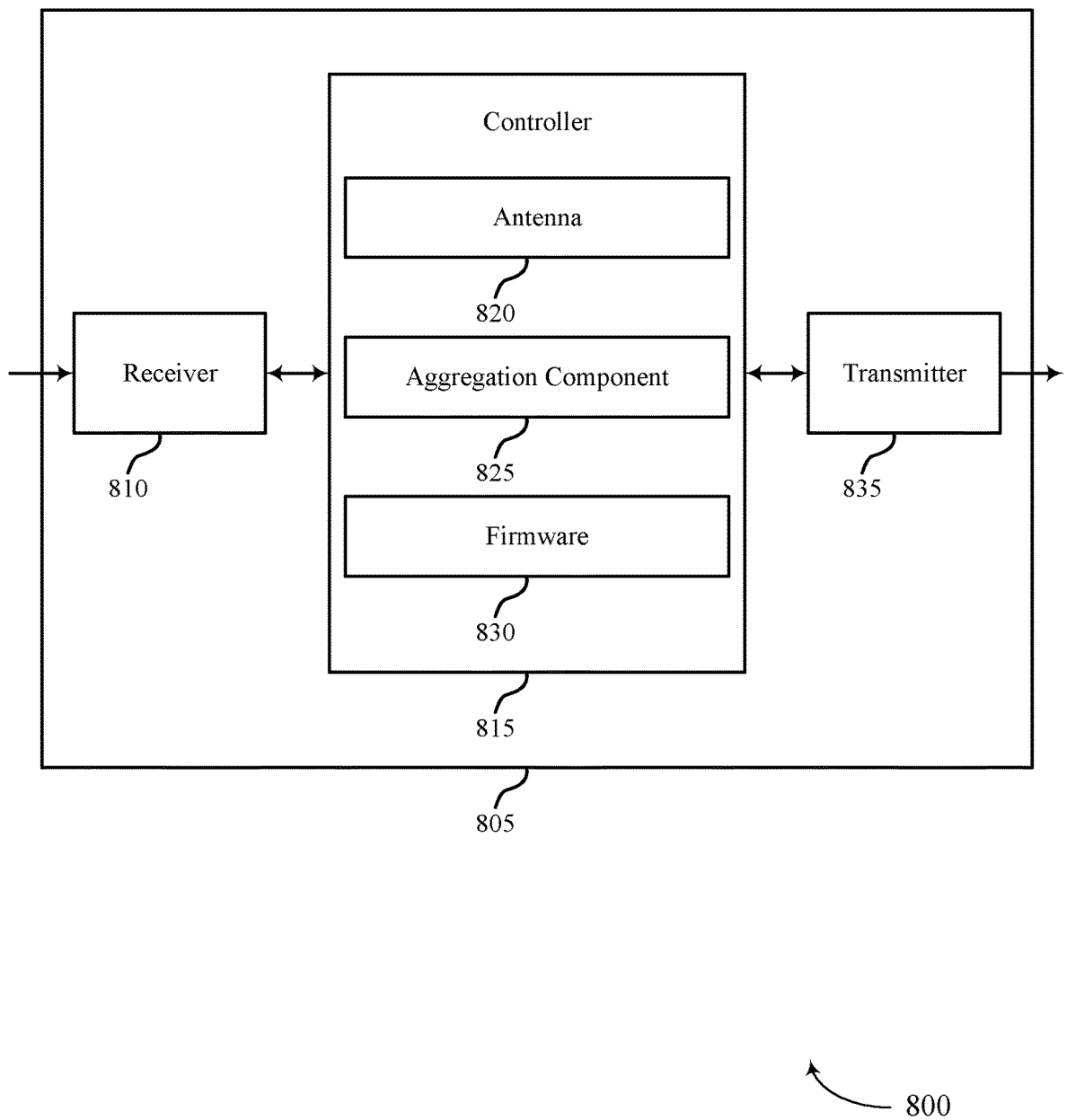

FIG. 8 shows a block diagram 800 of a device 805 that supports common automatic gain control across multiple radio access technologies in accordance with aspects of the present disclosure. The device 805 may be an example of aspects of a device 705, or a UE 115 as described herein. The device 805 may include a receiver 810, a controller 815, and a transmitter 835. The device 805 may also include a processor. Each of these components may be in communication with one another (e.g., via one or more buses).

The receiver 810 may receive information, such as packets, user data, or control information associated with various information channels (e.g., control channels, data channels, and information related to common automatic gain control across multiple radio access technologies, etc.). Information may be passed on to other components of the device 805. The receiver 810 may be an example of aspects of the transceiver 1020 described with reference to FIG. 10. The receiver 810 may utilize a single antenna or a set of antennas.

The controller 815 may be an example of aspects of the controller 715 as described herein. The controller 815 may include an antenna 820, an aggregation component 825, and a firmware 830. The controller 815 may be an example of aspects of the controller 1010 described herein.

The antenna 820 may measure a first signal power for a first RAT and a second signal power for a second RAT different from the first RAT.

The aggregation component 825 may determine a common gain state for the first RAT and the second RAT based on the first signal power and the second signal power. The aggregation component 825 may determine a common gain state for the first RAT and the second RAT based on inputting the first signal power and the second signal power into an aggregation function.

The firmware 830 may apply the common gain state to a first receiver chain within the UE for the first RAT and to a second receiver chain within the UE for the second RAT, where the first receiver chain and the second receiver chain share at least one shared LNA.

The transmitter 835 may transmit signals generated by other components of the device 805. In some examples, the transmitter 835 may be collocated with a receiver 810 in a transceiver module. For example, the transmitter 835 may be an example of aspects of the transceiver 1020 described with reference to FIG. 10, The transmitter 835 may utilize a single antenna or a set of antennas.

A processor of a UE 115 (e.g., controller the receiver 810, the transmitter 835, or the transceiver 1020 as described with reference to FIG. 10) may efficiently operate firmware and other components of the UE 115 to determine the shared common gain for cases where the circuitry of the UE 115 is configured for a shared LNA. The processor of the UE 115 may further operate components and circuitry to apply the determined common gain to receive chains for different RATs. This may enable a UE 115 to improve reliability by avoiding incorrect gain states between RATs, and also avoiding mobility issues and call drops.

Figure 9:
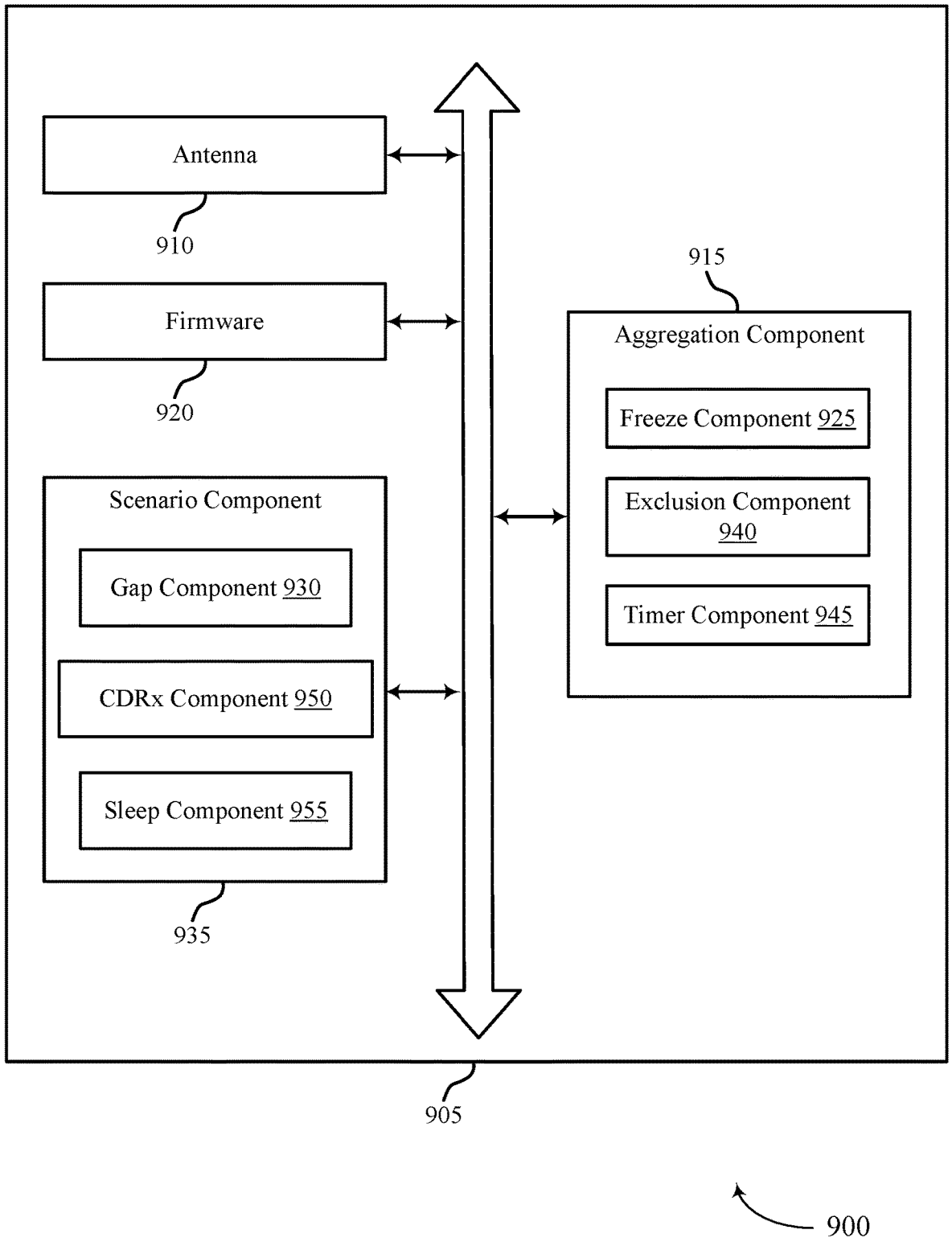
FIG. 9 shows a block diagram of a controller that supports common automatic gain control across multiple radio access technologies in accordance with aspects of the present disclosure.

FIG. 9 shows a block diagram 900 of a controller 905 that supports common automatic gain control across multiple radio access technologies in accordance with aspects of the present disclosure. The controller 905 may be an example of aspects of a controller 715, a controller 815, or a controller 1010 described herein. The controller 905 may include an antenna 910, an aggregation component 915, a firmware 920, a freeze component 925, a gap component 930, a scenario 935, an exclusion component 940, a timer component 945, a CDRx/ARD component 950, and a sleep component 955, Aggregation component 915 may include freeze component 925, exclusion component 940, and timer component 945. Scenario component 935 may include gap component 930, CDRx component 950, sleep component 955. Each of these modules may communicate, directly or indirectly, with one another (e.g., via one or more buses).

The antenna 910 may measure a first signal power for a first RAT and a second signal power for a second RAT different from the first RAT. In some examples, the antenna. 910 may measure first signal strength indicators that are based on measurements from one or more carriers associated with the first RAT.

In some examples, the antenna 910 may measure second signal strength indicators that are based on measurements from one or more carriers associated with the second RAT, where the first signal power and the second signal power are based on first and second signal strength indicators. In some examples, the antenna 910 may receive a request to freeze the common gain state, for a duration, based on a first gain state for the first RAT or a second gain state for the second RAT.

The aggregation component 915 may determine a common gain state for the first RAT and the second RAT based on the first signal power and the second signal power. In some examples, the aggregation component 915 may determine a common gain state for the first RAT and the second RAT based on inputting the first signal power and the second signal power into an aggregation function. In some examples, the aggregation component 915 may aggregate the first signal strength indicators across the one or more carriers associated with the first RAT to generate first aggregated signal strength indicators. In some examples, the aggregation component 915 may aggregate the second signal strength indicators across the one or more carriers associated with the second RAT to generate second aggregated signal strength indicators. In some cases, the aggregation function is further based on a gain state for the first RAT, the second RAT, or both.

In some cases, the aggregation function includes a weighted average of the first signal power and the second signal power. In some cases, the weighted average of the first signal power and the second signal power includes a weighted average of signal powers for a set of carriers associated with the first RAT, the second RAT, or both. In some cases, the aggregation function includes a maximum of a first gain state associated with the first signal power and a second gain state associated with the second signal power.

In some cases, the UE includes a first subscriber identity module (SIM) for the first RAT and a second SIM for the second RAT.

The firmware 920 may apply the common gain state to a first receiver chain within the UE for the first RAT and to a second receiver chain within the UE for the second RAT, where the first receiver chain and the second receiver chain share at least one shared LNA. In some examples, the firmware 920 may override the common gain state with a different gain state that is selected for the first RAT or the second RAT.

Aggregation component 915 may operate the freeze component 925 to reject the request to freeze the common gain state. In some examples, aggregation component 915 may operate the freeze component 925 to apply a freeze to the common gain state, for the duration, based on the request. In some examples, the freeze component 925 may apply a subsequent common gain state to the first receiver chain and the second receiver chain after the duration.

Aggregation component 915 may also operate exclusion component 940 to perform exclusion operations and timer component 945 to perform timing operations.

Scenario component 935 may operate the gap component 930 to handle a first gain state for the first RAT and a second gain state for the second RAT within a threshold time of a common inter-RAT gap opening wherein the first RAT and the second RAT are inactive. In some examples, the aggregation component 915 may determine a first common gain state outside of the common inter-RAT gap opening and a second common gain state during the common inter-RAT gap opening based at least in part on configuring one or more simultaneous measurements of the first RAT and the second RAT using the shared LNA Scenario component 935 may also operate CDRx component 950 to perform CDRx operations and sleep component 955 to perform sleep operations.

Figure 10:
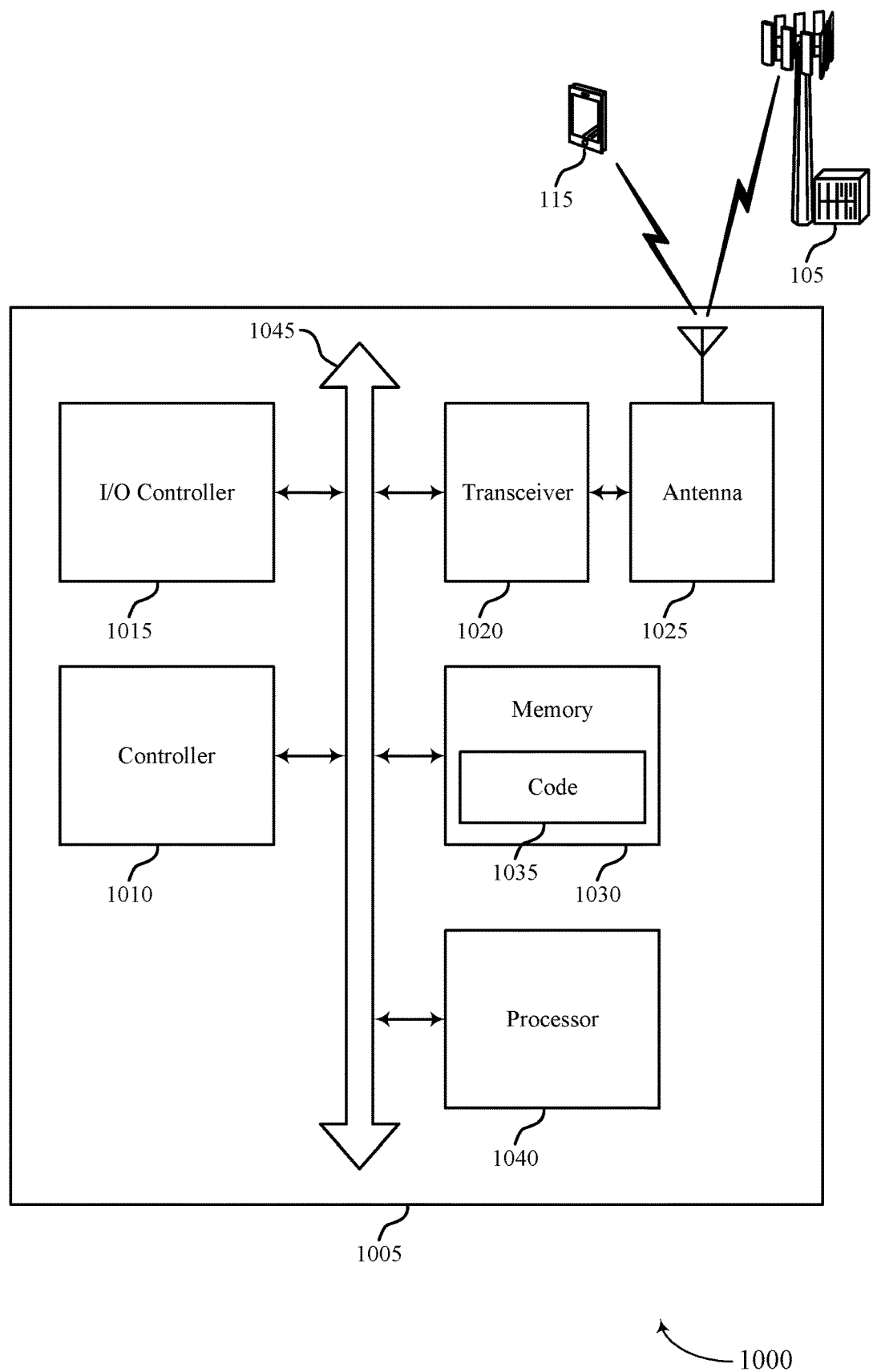
FIG. 10 shows a diagram of a system including a device that supports common automatic gain control across multiple radio access technologies in accordance with aspects of the present disclosure.

FIG. 10 shows a diagram of a system 1000 including a device 1005 that supports common automatic gain control across multiple radio access technologies in accordance with aspects of the present disclosure. The device 1005 may be an example of or include the components of device 705, device 505, or a UE 115 as described herein. The device 1005 may include components for bi-directional voice and data communications including components for transmitting and receiving communications, including a controller 1010, an I/O controller 1015, a transceiver 1020, an antenna 1025, memory 1030, and a processor 1040. These components may be in electronic communication via one or more buses (e.g., bus 1045).

The controller 1010 may measure a first signal power for a first RAT and a second signal power for a second RAT different from the first RAT, determine a common gain state for the first RAT and the second RAT based on the first signal power and the second signal power, and apply the common gain state to a first receiver chain within the UE for the first RAT and to a second receiver chain within the UE for the second RAT, where the first receiver chain and the second receiver chain share at least one shared LNA.

The I/O controller 1015 may manage input and output signals for the device 1005. The I/O controller 1015 may also manage peripherals not integrated into the device 1005. In some cases, the I/O controller 1015 may represent a physical connection or port to an external peripheral. In some cases, the I/O controller 1015 may utilize an operating system such as iOS®, ANDROID®, MS-DOS®, MS-WINDOWS®, OS/2®, UNIX®, LINUX®, or another known operating system. In other cases, the I/O controller 1015 may represent or interact with a modem, a keyboard, a mouse, a touchscreen, or a similar device. In some cases, the I/O controller 1015 may be implemented as part of a processor. In some cases, a user may interact with the device 1005 via the I/O controller 1015 or via hardware components controlled by the I/O controller 1015.

The transceiver 1020 may communicate bi-directionally, via one or more antennas, wired, or wireless links as described above. For example, the transceiver 1020 may represent a wireless transceiver and may communicate bi-directionally with another wireless transceiver. The transceiver 1020 may also include a modem to modulate the packets and provide the modulated packets to the antennas for transmission, and to demodulate packets received from the antennas.

In some cases, the wireless device may include a single antenna 1025. However, in some cases the device may have more than one antenna 1025, which may be capable of concurrently transmitting or receiving multiple wireless transmissions.

The memory 1030 may include random-access memory (RAM) and read-only memory (ROM). The memory 1030 may store computer-readable, computer-executable code 1035 including instructions that, when executed, cause the processor to perform various functions described herein. In some cases, the memory 1030 may contain, among other things, a basic I/O system (BIOS) which may control basic hardware or software operation such as the interaction with peripheral components or devices.

The processor 1040 may include an intelligent hardware device, (e.g., a general-purpose processor, a DSP, a CPU, a microcontroller, air ASIC an FPGA, a programmable logic device, a discrete gate or transistor logic component, a discrete hardware component, or any combination thereof). In some cases, the processor 1040 may be configured to operate a memory array using a memory controller. In other cases, a memory controller may be integrated into the processor 1040. The processor 1040 may be configured to execute computer-readable instructions stored in a memory (e.g., the memory 1030) to cause the device 1005 to perform various functions (e.g., functions or tasks supporting common automatic gain control across multiple radio access technologies).

The code 1035 may include instructions to implement aspects of the present disclosure, including instructions to support wireless communications. The code 1035 may be stored in a non-transitory computer-readable medium such as system memory or other type of memory. In some cases, the code 1035 may not be directly executable by the processor 1040 but may cause a computer (e.g., when compiled and executed) to perform functions described herein.

Figure 11:
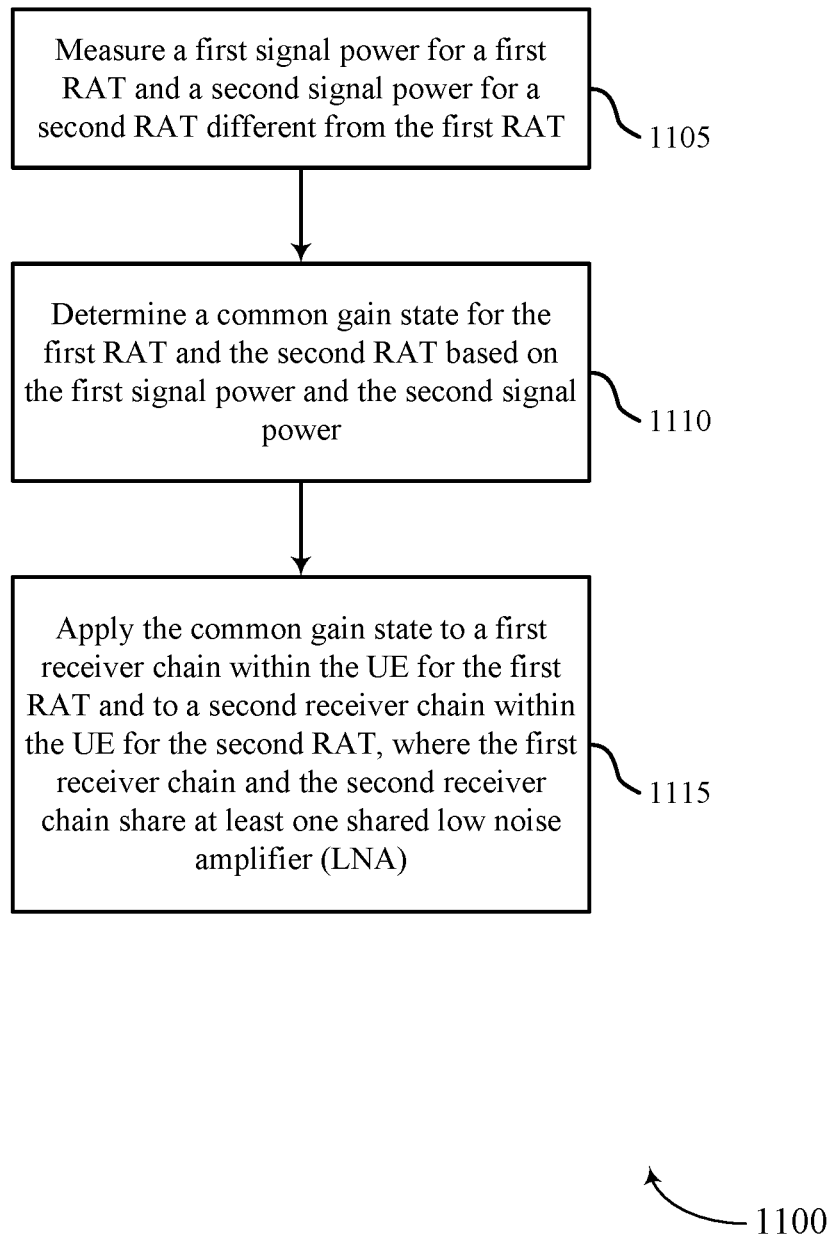
FIGS. 11 through 13 show flowcharts illustrating methods that support common automatic gain control across multiple radio access technologies in accordance with aspects of the present disclosure.

FIG. 11 shows a flowchart illustrating a method 1100 that supports common automatic gain control across multiple radio access technologies in accordance with aspects of the present disclosure. The operations of method 1100 may be implemented by a UE 115 or its components as described herein. For example, the operations of method 1100 may be performed by a controller as described with reference to FIGS. 7 through 10. In some examples, a UE, may execute a se of instructions to control the functional elements of the UE to perform the functions described below. Additionally or alternatively, a UE may perform aspects of the functions described below using special-purpose hardware.

At 1105, the UE may measure a first signal power for a first RAT and a second signal power for a second RAT different from the first RAT. The operations of 1105 may be performed according to the methods described herein. In some examples, aspects of the operations of 1105 may be performed by an antenna as described with reference to FIGS. 7 through 10.

At 1110, the UE may determine a common gain state for the first RAT and the second RAT based on the first signal power and the second signal power. The operations of 1110 may be performed according to the methods described herein. In some examples, aspects of the operations of 1110 may be performed by an aggregation component as described with reference to FIGS. 7 through 10.

At 1115, the UF, may apply the common gain state to a first receiver chain within the UE for the first RAT and to a second receiver chain within the UE for the second RAT, where the first receiver chain and the second receiver chain share at least one shared LNA. The operations of 1115 may be performed according to the methods described herein. In some examples, aspects of the operations of 1115 may be performed by a firmware as described with reference to FIGS. 7 through 10.

Figure 12:
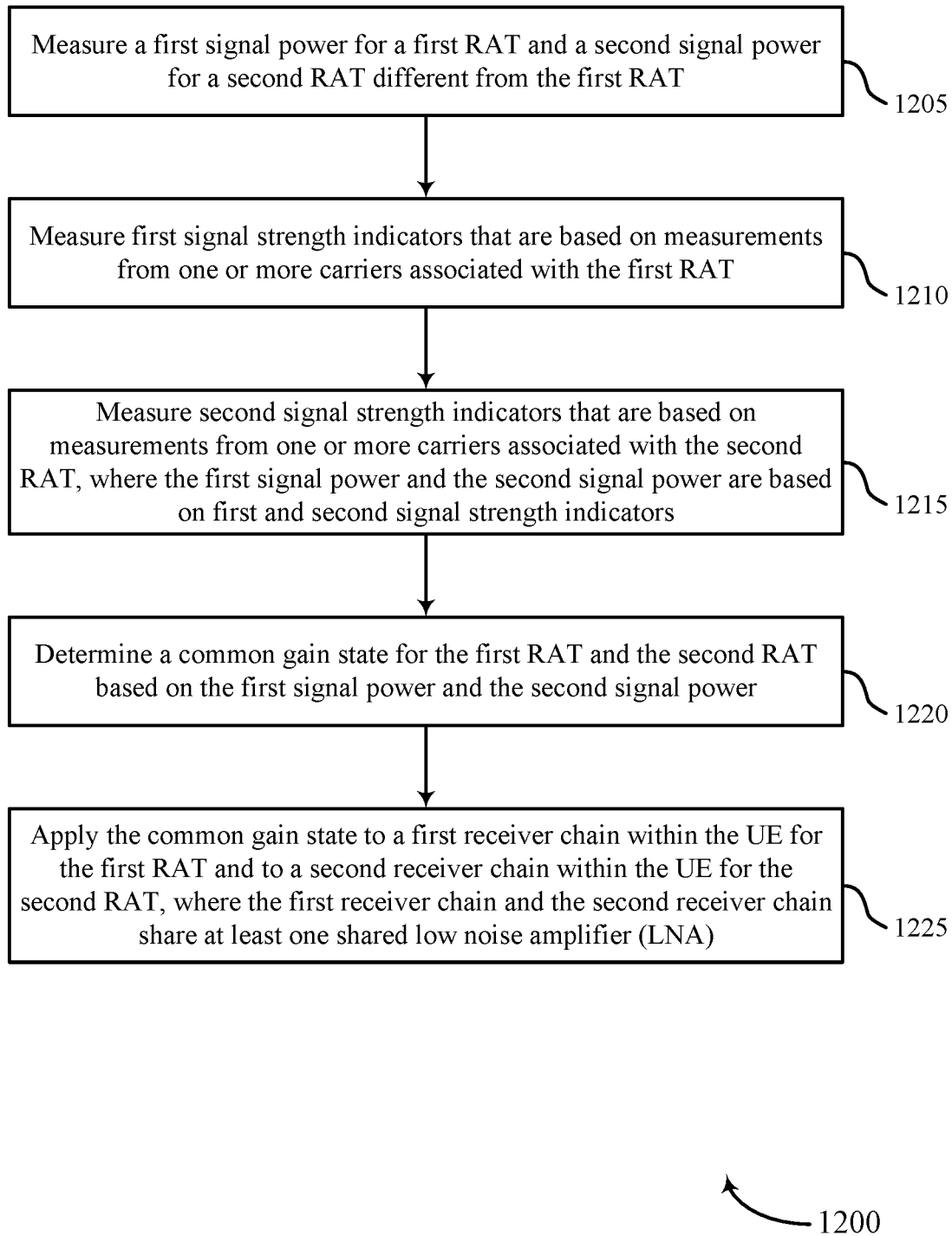

FIG. 12 shows a flowchart illustrating a method 1200 that supports common automatic gain control across multiple radio access technologies in accordance with aspects of the present disclosure. The operations of method 1200 may be implemented by a UE 115 or its components as described herein. For example, the operations of method 1200 may be performed by a controller as described with reference to FIGS. 7 through 10. In some examples, a UE may execute a set of instructions to control the functional elements of the UE to perform the functions described below. Additionally or alternatively, a UE may perform aspects of the functions described below using special-purpose hardware.

At 1205, the UF, may measure a first signal power for a first RAT and a second signal power for a second RAT different from the first RAT. The operations of 1205 may be performed according to the methods described herein. In some examples, aspects of the operations of 1205 may be performed by an antenna as described with reference to FIGS. 7 through 10.

At 1210, the UE may measure first signal strength indicators that are based on measurements from one or more carriers associated with the first RAT. The operations of 1210 may be performed according to the methods described herein. In some examples, aspects of the operations of 1210 may be performed by an antenna as described with reference to FIGS. 7 through 10.

At 1215, the UE may measure second signal strength indicators that are based on measurements from one or more carriers associated with the second RAT, where the first signal power and the second signal power are based on first and second signal strength indicators. The operations of 1215 may be performed according to the methods described herein. In some examples, aspects of the operations of 1215 may be performed by an antenna as described with reference to FIGS. 7 through 10.

At 1220, the UE may determine a common gain state for the first RAT and the second RAT based on the first signal power and the second signal power. The operations of 1220 may be performed according to the methods described herein. In some examples, aspects of the operations of 1220 may be performed by an aggregation component as described with reference to FIGS. 7 through 10.

At 1225, the UE may apply the common gain state to a first receiver chain within the UE for the first RAT and to a second receiver chain within the UE for the second RAT, where the first receiver chain and the second receiver chain share at least one shared LNA. The operations of 1225 may be performed according to the methods described herein. In some examples, aspects of the operations of 1225 may be performed by a firmware as described with reference to FIGS. 7 through 10.

Figure 13:
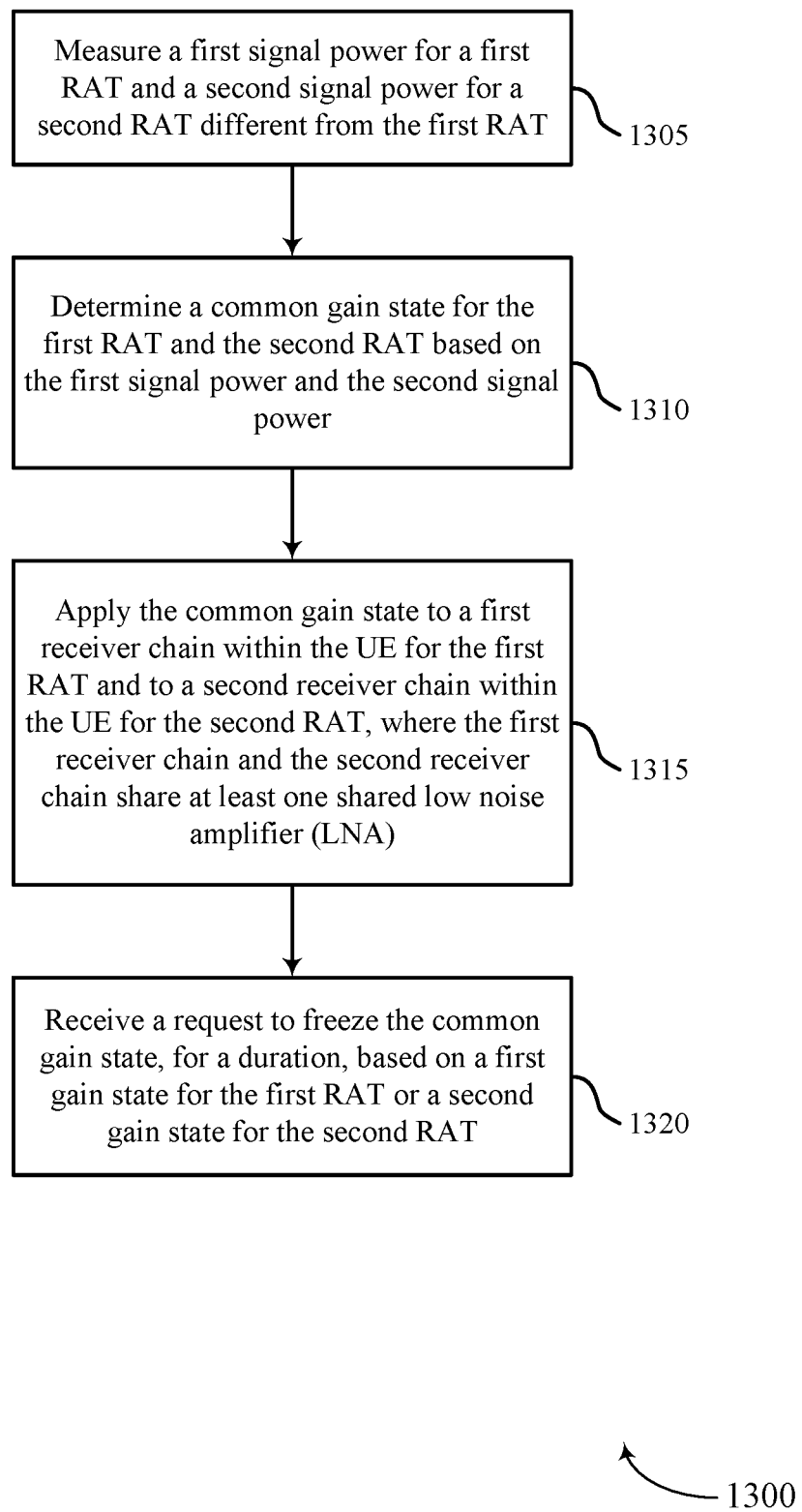

FIG. 13 shows a flowchart illustrating a method 1300 that supports common automatic gain control across multiple radio access technologies in accordance with aspects of the present disclosure. The operations of method 1300 may be implemented by a UE 115 or its components as described herein. For example, the operations of method 1300 may be performed by a controller as described with reference to FIGS. 7 through 10. In some examples, a UE may execute a set of instructions to control the functional elements of the UE to perform the functions described below. Additionally or alternatively, a UE may perform aspects of the functions described below using special-purpose hardware.

At 1305, the UE may measure a first signal power for a first RAT and a second signal power for a second RAT different from the first RAT. The operations of 1305 may be performed according to the methods described herein. In some examples, aspects of the operations of 1305 may be performed by an antenna as described with reference to FIGS. 7 through 10.

At 1310, the UE may determine a common gain state for the first RAT and the second RAT based on the first signal power and the second signal power. The operations of 1310 may be performed according to the methods described herein. In some examples, aspects of the operations of 1310 may be performed by an aggregation component as described with reference to FIGS. 7 through 10.

At 1315, the UE may apply the common gain state to a first receiver chain within the UE for the first RAT and to a second receiver chain within the UE for the second RAT, where the first receiver chain and the second receiver chain share at least one shared IAA. The operations of 1315 may be performed according to the methods described herein. In some examples, aspects of the operations of 1315 may be performed by a firmware as described with reference to FIGS. 7 through 10.

At 1320, the UE may receive a request to freeze the common gain state, for duration, based on a first gain state for the first RAT or a second gain state for the second RAT. The operations of 1320 may be performed according to the methods described herein. In some examples, aspects of the operations of 1320 may be performed by an antenna as described with reference to FIGS. 7 through 10.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special purpose computer. By way of example, and not limitation, non-transitory computer-readable media may include random-access memory (RAM), read-only memory (ROM), electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as at least one of or "one or more of") indicates an inclusive list such that, for example, a list of at least one of A, B, or C means A or B er C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communications at a user equipment (UE), comprising:
   measuring a first signal power for a first radio access technology (RAT) and a second signal power for a second RAT different from the first RAT;
   determining a common gain state for the first RAT and the second RAT based at least in part on the first signal power and the second signal power; and
   applying the common gain state to a first receiver chain within the UE for the first RAT and to a second receiver chain within the UE for the second RAT, wherein the first receiver chain and the second receiver chain share at least one shared low noise amplifier (LNA).

2. The method of claim 1, further comprising:
   measuring first signal strength indicators that are based at least in part on measurements from one or more carriers associated with the first RAT; and
   measuring second signal strength indicators that are based at least in part on measurements from one or more carriers associated with the second RAT, wherein the first signal power and the second signal power are based at least in part on first and second signal strength indicators.

3. The method of claim 2, further comprising:
   aggregating the first signal strength indicators across the one or more carriers associated with the first RAT to generate first aggregated signal strength indicators; and
   aggregating the second signal strength indicators across the one or more carriers associated with the second RAT to generate second aggregated signal strength indicators.

4. The method of claim 1, further comprising:
   receiving a request to freeze the common gain state, for a duration, based at least in part on a first gain state for the first RAT or a second gain state for the second RAT.

5. The method of claim 4, further comprising:
   rejecting the request to freeze the common gain state.

6. The method of claim 4, further comprising:
   applying a freeze to the common gain state, for the duration, based at least in part on the request; and
   applying a subsequent common gain state to the first receiver chain and the second receiver chain after the duration.

7. The method of claim 1, further comprising:
   overriding the common gain state with a different gain state that is selected for the first RAT or the second RAT.

8. The method of claim 1, further comprising:
   handling a first gain state for the first RAT and a second gain state for the second RAT within a threshold time of a common inter-RAT gap opening wherein the first RAT and the second RAT are inactive; and
   determining a first common gain state outside of the common inter-RAT gap opening and a second common gain state during the common inter-RAT gap opening based at least in part on configuring one or more simultaneous measurements of the first RAT and the second RAT using the shared LNA.

9. The method of claim 1, further comprising:
   determining the common gain state for the first RAT and the second RAT based at least in part on inputting the first signal power and the second signal power into an aggregation function.

10. The method of claim 9, wherein the aggregation function comprises a weighted average of the first signal power and the second signal power.

11. The method of claim 10, wherein the weighted average of the first signal power and the second signal power comprises a weighted average of signal powers for a plurality of carriers associated with the first RAT, the second RAT, or both.

12. The method of claim 9, wherein the aggregation function comprises a maximum of a first gain state associated with the first signal power and a second gain state associated with the second signal power.

13. The method of claim 9, wherein the aggregation function is further based at least in part on a gain state for the first RAT, the second RAT, or both.

14. The method of claim 1, wherein the UE comprises a first subscriber identity module (SIM) for the first RAT and a second SIM for the second RAT.

15. An apparatus for wireless communications at a user equipment (UE), comprising:
    a processor,
    memory coupled with the processor; and
    instructions stored in the memory and executable by the processor to cause the apparatus to:
      measure a first signal power for a first radio access technology (RAT) and a second signal power for a second RAT different from the first RAT;
      determine a common gain state for the first RAT and the second RAT based at least in part on the first signal power and the second signal power; and
      apply the common gain state to a first receiver chain within the UE for the first RAT and to a second receiver chain within the UE for the second RAT, wherein the first receiver chain and the second receiver chain share at least one shared low noise amplifier (LNA).

16. The apparatus of claim 15, wherein the instructions are further executable by the processor to cause the apparatus to:
    measure first signal strength indicators that are based at least in part on measurements from one or more carriers associated with the first RAT; and
    measure second signal strength indicators that are based at least in part on measurements from one or more carriers associated with the second RAT, wherein the first signal power and the second signal power are based at least in part on first and second signal strength indicators.

17. The apparatus of claim 16, wherein the instructions are further executable by the processor to cause the apparatus to:
aggregate the first signal strength indicators across the one or more carriers associated with the first RAT to generate first aggregated signal strength indicators; and
aggregate the second signal strength indicators across the one or more carriers associated with the second RAT to generate second aggregated signal strength indicators.

18. The apparatus of claim 15, wherein the instructions are further executable by the processor to cause the apparatus to:
receive a request to freeze the common gain state, for a duration, based at least in part on a first gain state for the first RAT or a second gain state for the second RAT.

19. The apparatus of claim 18, wherein the instructions are further executable by the processor to cause the apparatus to:
reject the request to freeze the common gain state.

20. The apparatus of claim 18, wherein the instructions are further executable by the processor to cause the apparatus to:
apply a freeze to the common gain state, for the duration, based at least in part on the request; and
apply a subsequent common gain state to the first receiver chain and the second receiver chain after the duration.

21. The apparatus of claim 15, wherein the instructions are further executable by the processor to cause the apparatus to:
override the common gain state with a different gain state that is selected for the first RAT or the second RAT.

22. The apparatus of claim 15, wherein the instructions are further executable by the processor to cause the apparatus to:
handle a first gain state for the first RAT and a second gain state for the second RAT within a threshold time of a common inter-RAT gap opening wherein the first RAT and the second RAT are inactive; and
determine a first common gain state outside of the common inter-RAT gap opening and a second common gain state during the common inter-RAT gap opening based at least in part on configuring one or more simultaneous measurements of the first RAT and the second RAT using the shared LNA.

23. The apparatus of claim 15, wherein the instructions are further executable by the processor to cause the apparatus to:
determine the common gain state for the first RAT and the second RAT based at least in part on inputting the first signal power and the second signal power into an aggregation function.

24. The apparatus of claim 23, wherein the aggregation function comprises a weighted average of the first signal power and the second signal power.

25. The apparatus of claim 24, wherein the weighted average of the first signal power and the second signal power comprises a weighted average of signal powers for a plurality of carriers associated with the first RAT, the second RAT, or both.

26. The apparatus of claim 23, wherein the aggregation function comprises a maximum of a first gain state associated with the first signal power and a second gain state associated with the second signal power.

27. The apparatus of claim 23, wherein the aggregation function is further based at least in part on a gain state for the first RAT, the second RAT, or both.

28. The apparatus of claim 15, wherein the UE comprises a first subscriber identity module (SIM) for the first RAT and a second SIM for the second RAT.

29. An apparatus for wireless communications at a user equipment (UE), comprising:
means for measuring a first signal power for a first radio access technology (RAT) and a second signal power for a second RAT different from the first RAT;
means for determining a common gain state for the first RAT and the second RAT based at least in part on the first signal power and the second signal power; and
means for applying the common gain state to a first receiver chain within the UE for the first RAT and to a second receiver chain within the UE for the second RAT, wherein the first receiver chain and the second receiver chain share at least one shared low noise amplifier (LNA).

30. A non-transitory computer-readable medium storing code for wireless communications at a user equipment (UE), the code comprising instructions executable by a processor to:
measure a first signal power for a first radio access technology (RAT) and a second signal power for a second RAT different from the first RAT;
determine a common gain state for the first RAT and the second RAT based at least in part on the first signal power and the second signal power; and
apply the common gain state to a first receiver chain within the UE for the first RAT and to a second receiver chain within the UE for the second RAT, wherein the first receiver chain and the second receiver chain share at least one shared low noise amplifier (LNA).

* * * * *